(12) United States Patent  (10) Patent No.: US 7,370,307 B2
Seta                      (45) Date of Patent:    May 6, 2008

(54) COMPUTER AUTOMATED DESIGN SYSTEM, A COMPUTER AUTOMATED DESIGN METHOD, AND A SEMICONDUCTOR INTEGRATED CIRCUIT

(75) Inventor: Shoji Seta, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 270 days.

(21) Appl. No.: 11/249,388

(22) Filed: Oct. 14, 2005

(65) Prior Publication Data

US 2006/0081991 A1    Apr. 20, 2006

(30) Foreign Application Priority Data

Oct. 15, 2004   (JP)   ............... 2004-301663

(51) Int. Cl.
  *G06F 17/50*  (2006.01)
  *H01L 29/40*  (2006.01)
(52) U.S. Cl. ........................................ 716/12
(58) Field of Classification Search ............ 716/12–14; 257/758
  See application file for complete search history.

(56) References Cited

U.S. PATENT DOCUMENTS

| 5,671,173 | A | 9/1997 | Tomita |
| 6,645,842 | B2 | 11/2003 | Igarashi et al. |
| 6,813,756 | B2 | 11/2004 | Igarashi et al. |
| 6,849,923 | B2 | 2/2005 | Seta et al. |
| 6,858,935 | B1* | 2/2005 | Teig et al. .................. 257/758 |
| 7,096,449 | B1* | 8/2006 | Teig et al. .................... 716/12 |
| 2004/0098697 | A1* | 5/2004 | Frankle et al. ............... 716/13 |
| 2004/0103387 | A1* | 5/2004 | Teig et al. .................... 716/13 |
| 2005/0023694 | A1* | 2/2005 | Bjorkman et al. .......... 257/758 |
| 2005/0173799 | A1* | 8/2005 | Jou et al. .................... 257/751 |
| 2005/0176216 | A1* | 8/2005 | Cui et al. .................. 438/459 |
| 2005/0240893 | A1* | 10/2005 | Teig et al. .................... 716/13 |
| 2006/0081991 | A1* | 4/2006 | Seta .......................... 257/758 |

FOREIGN PATENT DOCUMENTS

JP   2004-31830   1/2004

* cited by examiner

*Primary Examiner*—Stacy Whitmore
(74) *Attorney, Agent, or Firm*—Oblon, Spivak, McClelland, Maier & Neustadt, P.C.

(57) ABSTRACT

A computer automated design system includes a subject routing module configured to set a first grid area and a first diagonal grid area and route a first wire in the first grid area and a first diagonal wire extending diagonally to a longitudinal direction of the first wire and a next routing module configured to set a second grid area and a second diagonal grid area and route a second wire in the second grid area and a second diagonal wire extending diagonally to a longitudinal direction of the second wire.

17 Claims, 34 Drawing Sheets

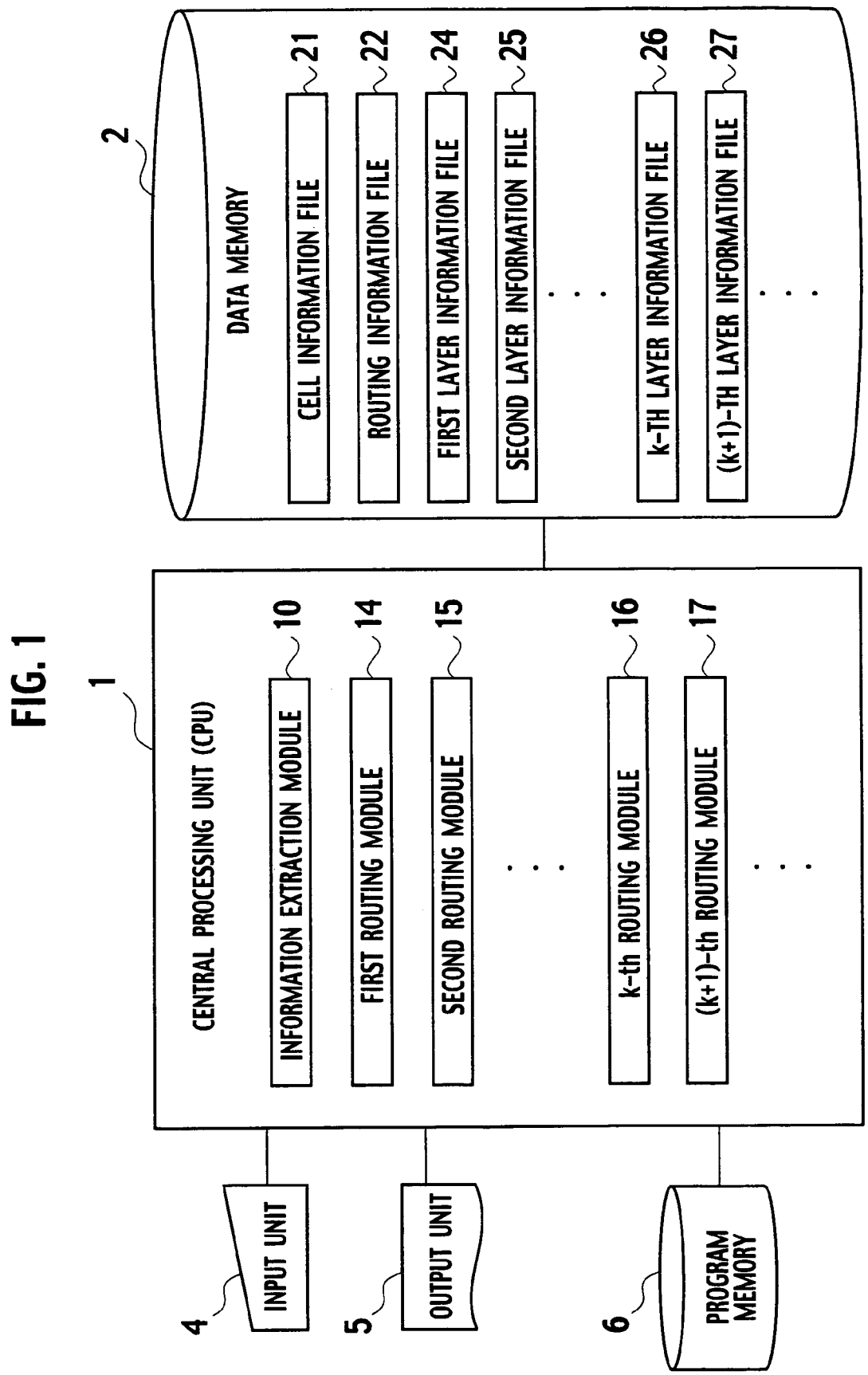

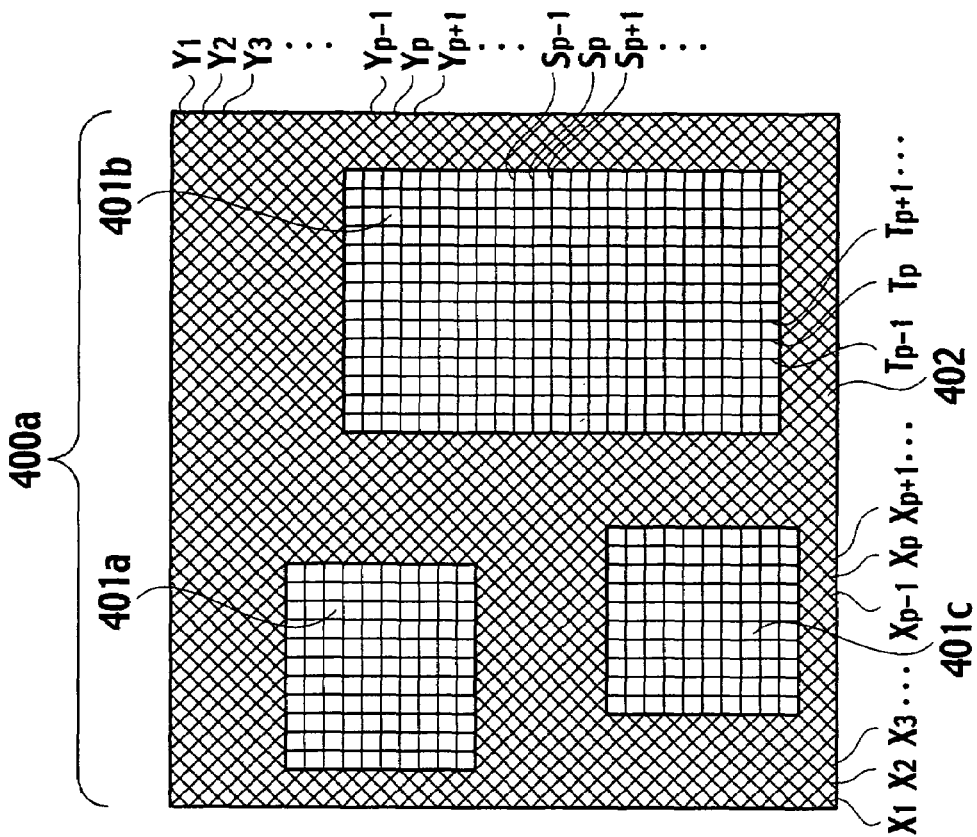
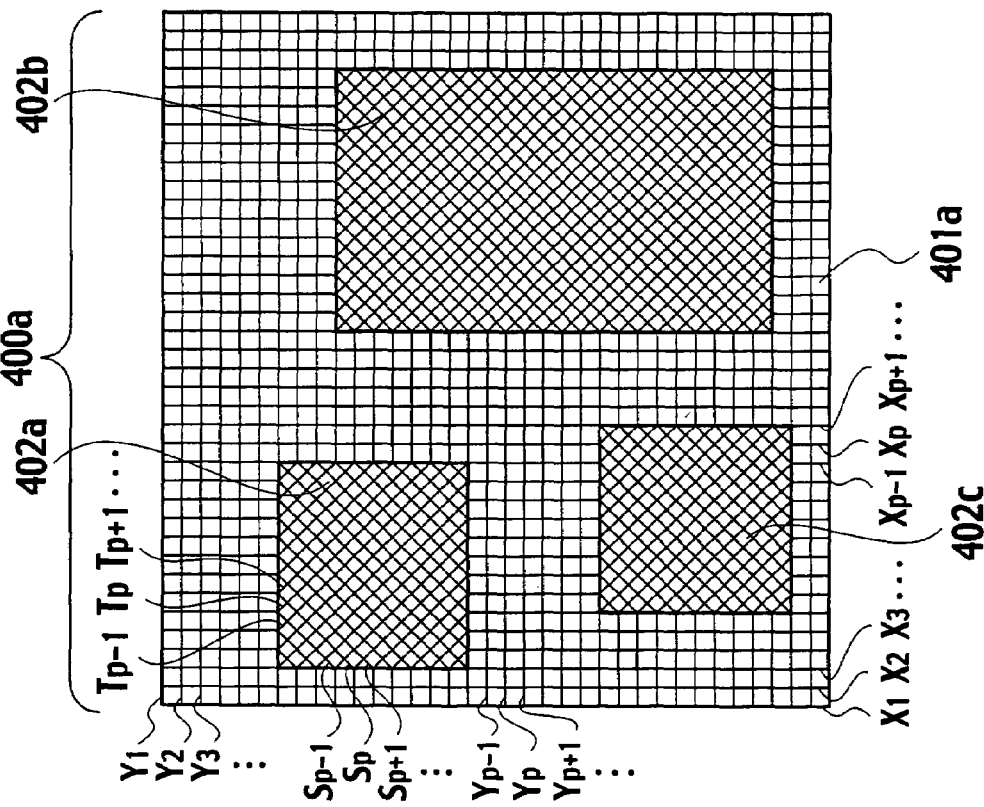
FIG. 3A
FIG. 3B

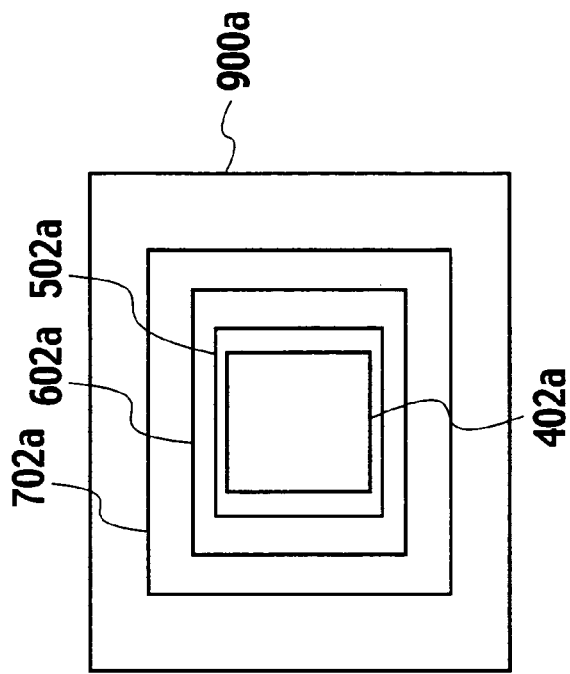
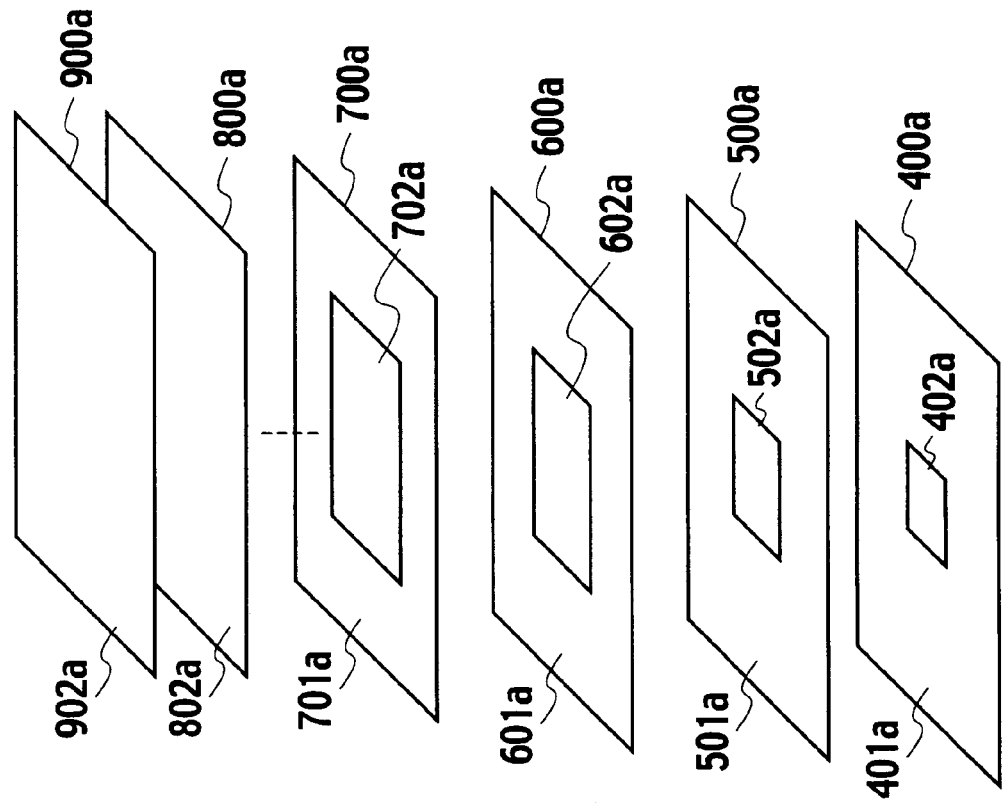
FIG. 39
FIG. 38

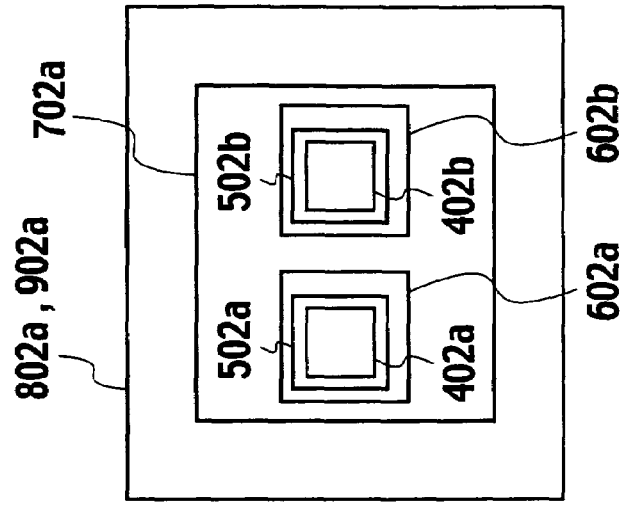
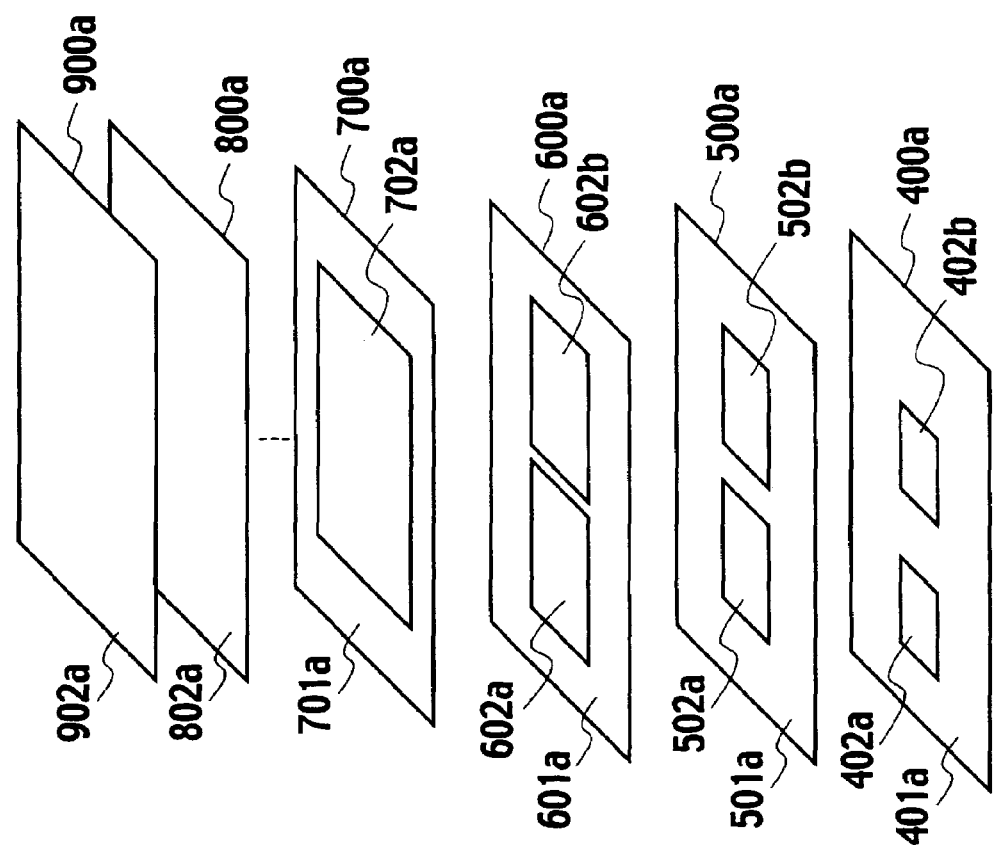

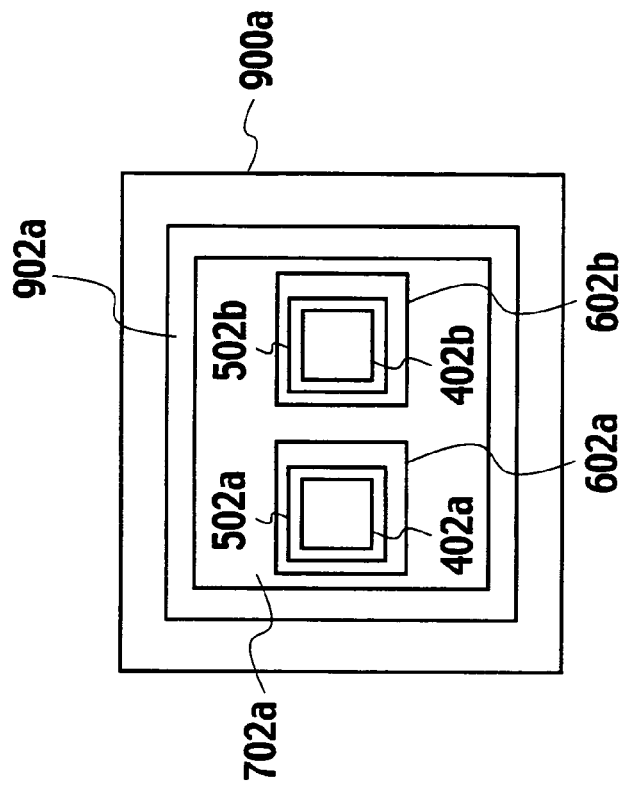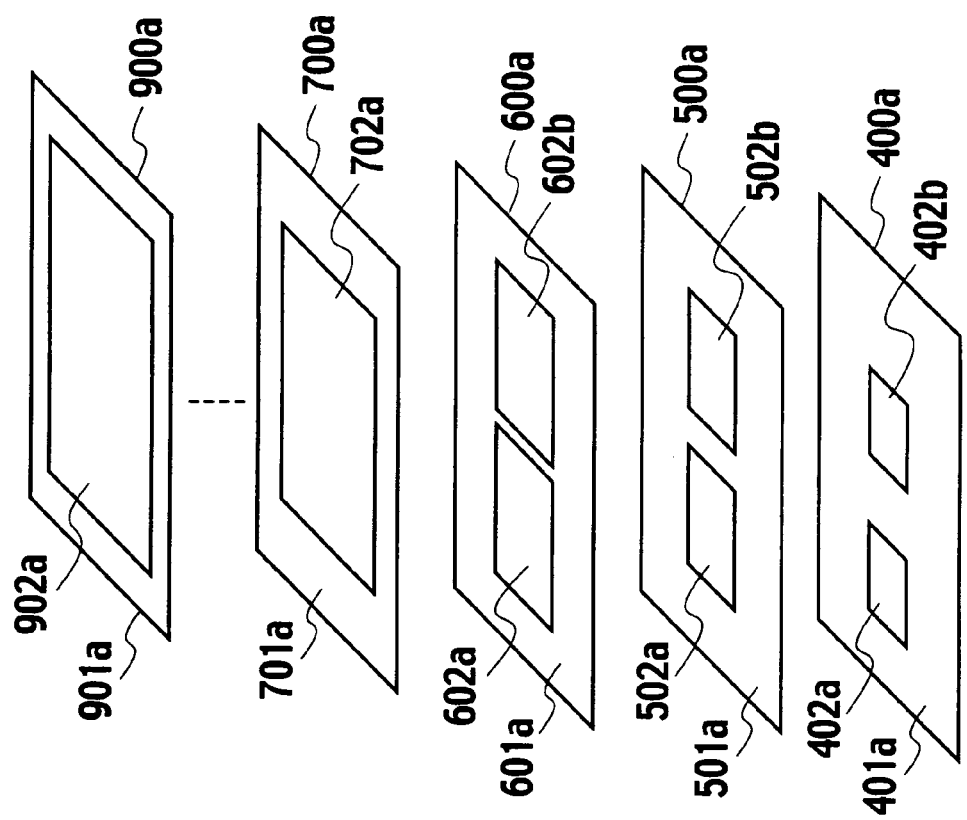

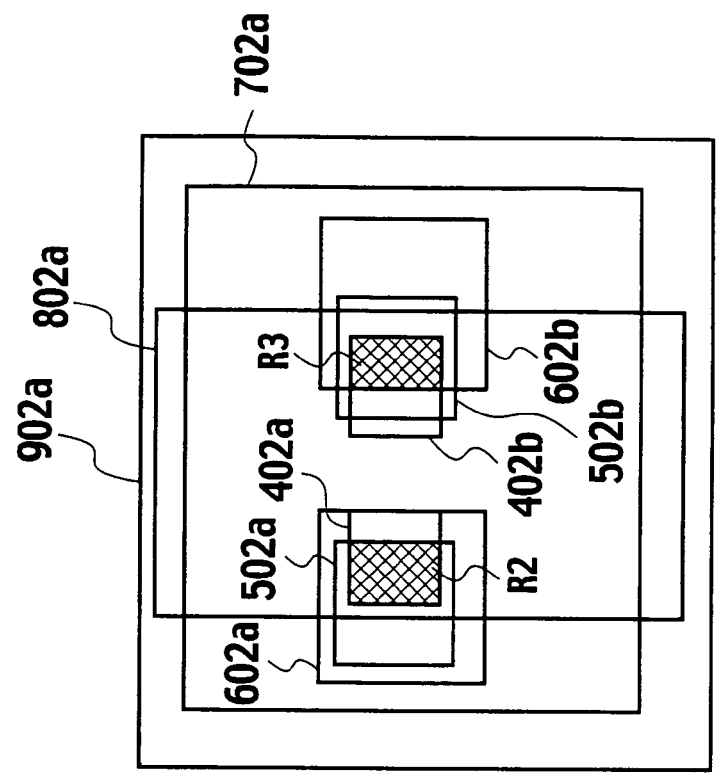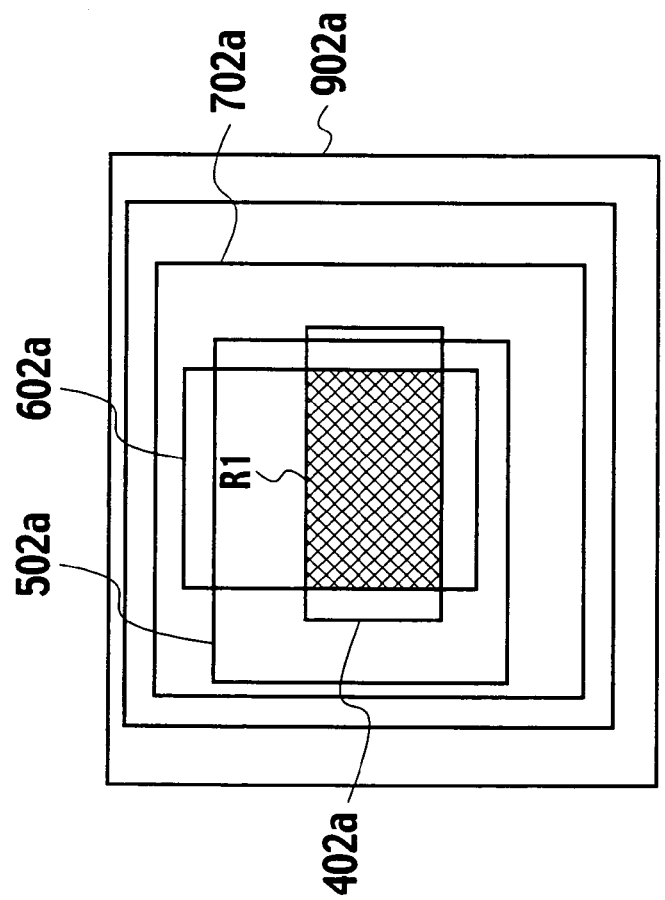

COMPUTER AUTOMATED DESIGN SYSTEM, A COMPUTER AUTOMATED DESIGN METHOD, AND A SEMICONDUCTOR INTEGRATED CIRCUIT

CROSS REFERENCE TO RELATED APPLICATIONS AND INCORPORATION BY REFERENCE

This application is based upon an claims the benefit of priority from prior Japanese Patent Application No. P2004-301663, filed on Oct. 15, 2004; the entire contents of which are incorporated herein by reference.

BACKGROUND OF THE INVENTION

1. Field of the Invention

The present invention relates to a semiconductor integrated circuit, more specifically to a computer automated design system and a computer automated design method for designing a semiconductor integrated circuit including orthogonal wirings and oblique wirings in a multi-level interconnect.

2. Description of the Related Art

Along with miniaturization of integrated circuits in recent years, problems with crosstalk between adjacent wires have been of concern. Especially in cases of a wire pitch of 90 nm or less, crosstalk is more likely to occur, and various technologies to suppress crosstalk have been examined.

The technologies to suppress the occurrence of crosstalk between wires include a multi-level interconnect technology using a diagonal interconnect technology. The diagonal interconnect technology utilizes "diagonal interconnect" with wires extended in directions of 45° and 135° while wires are extended in directions of 0° and 90° in "orthogonal interconnect". Employing the diagonal interconnect technology, a wire length can be shortened by the square root of double the wire length of the orthogonal interconnect. Therefore, the wiring area can be reduced to 30% and electric power consumption can be decreased, in comparison with the orthogonal interconnect. Since the wiring area is reduced by utilizing the diagonal interconnect technology, a pitch of diagonal wires can be magnified and the design rule can be modified, in comparison with the orthogonal interconnect technology. Accordingly, crosstalk can be reduced.

However, in the multi-level interconnect technology using an diagonal interconnect technology currently used in general, a wiring layer where the diagonal routing grid is simply arranged is placed in a layer above a wiring layer where the routing grid of the orthogonal interconnect is placed. Therefore, there is a tendency that grid points of the routing grid of the orthogonal interconnect do not match grid points of the routing grid of the diagonal interconnect. When the grid points do not match each other, in placement of a via hole in a portion where wires intersect at right angle, the via hole cannot be placed at any one of adjacent points of orthogonal interconnect and diagonal interconnect. The via hole must be therefore placed at another position. The problem of displacement of the grid points becomes more obvious with increasing reduction of wire width, and the design process is complicated due to restriction of placement positions of via holes.

SUMMARY OF THE INVENTION

An aspect of the present invention inheres in a computer automated design system, adapted for designing a multi-level interconnect of a semiconductor integrated circuit, encompassing a subject routing module configured to set a first grid area defined by a first line group and a second line group orthogonal to the first line group and a first diagonal grid area defined by a third line group extending diagonally to the first line group and a fourth line group orthogonal to the third line group in a subject wiring layer assigned as one of wiring layers in the multi-level interconnect, the third and fourth line groups being connected to the first to second line groups, and route a first wire in the first grid area and a first diagonal wire extending diagonally to a longitudinal direction of the first wire in the first diagonal grid area based on the first to fourth line groups; and a next routing module configured to set a second grid area defined by the first and second line groups and a second diagonal grid area defined by the third and fourth line groups in an upper wiring layer assigned on the subject wiring layer in the multi-level interconnect so that the second grid area and second diagonal grid area overlap the first grid area and first diagonal grid area, and route a second wire in the second grid area and a second diagonal wire extending diagonally to a longitudinal direction of the second wire in the second diagonal grid area based on the first to fourth line groups.

Another aspect of the present invention inheres in a computer automated design method for designing a multi-level interconnect of a semiconductor integrated circuit, encompassing setting a first grid area defined by a first line group and a second line group orthogonal to the first line group and a first diagonal grid area defined by a third line group extending diagonally to the first line group and a fourth line group orthogonal to the third line group in a subject wiring layer assigned as one of wiring layers in the multi-level interconnect, the third and fourth line groups being connected to the first to second line groups, and route a first wire in the first grid area and a first diagonal wire extending diagonally to a longitudinal direction of the first wire in the first diagonal grid area based on the first to fourth line groups; and setting a second grid area defined by the first and second line groups and a second diagonal grid area defined by the third and fourth line groups in an upper wiring layer assigned on the subject wiring layer in the multi-level interconnect so that the second grid area and second diagonal grid area overlap the first grid area and first diagonal grid area, and route a second wire in the second grid area and a second diagonal wire extending diagonally to a longitudinal direction of the second wire in the second diagonal grid area based on the first to fourth line groups.

Still another aspect of the present invention inheres in a semiconductor integrated circuit including a multi-level interconnect, the multi-level interconnect encompassing a subject wiring layer assigned as one of wiring layers implementing the multi-level interconnect, including a subject wire area placing a subject wire extending along a first direction and a subject diagonal wire area placing a subject diagonal wire being connected to the subject wire and extended diagonally to the first direction; a first insulating film on the subject wiring layer; and an upper wiring layer provided on the first insulating film including an upper wire area placing an upper wire extending along the first direction and an upper diagonal wire area placing an upper diagonal wire connected to the upper wire and extended diagonally to the first direction, the upper wire area and the upper diagonal wire area being provided above the subject wire area and the subject diagonal wire area.

BRIEF DESCRIPTION OF DRAWINGS

FIG. 1 is a block diagram illustrating a computer automated design system according to the embodiment of the present invention;

FIGS. 3A is a plan view illustrating a layout of the first layer designed by the computer automated design system according to the first embodiment of the present invention;

FIGS. 3B is a plan view illustrating a layout of the first layer designed by the computer automated design system according to the first embodiment of the present invention;

FIG. 38 is a schematic diagram illustrating grid areas of the multi-level interconnect in the semiconductor integrated circuit according to the other embodiments of the present invention;

FIG. 39 is a plan view illustrating grid areas of the multi-level interconnect in the semiconductor integrated circuit according to the other embodiments of the present invention;

FIG. 40 is a schematic view illustrating grid areas of the multi-level interconnect in the semiconductor integrated circuit according to the other embodiments of the present invention;

FIG. 41 is a plan view illustrating grid areas of the multi-level interconnect in the semiconductor integrated circuit according to the other embodiments of the present invention;

FIG. 44 is a schematic view illustrating grid areas of the multi-level interconnect in the semiconductor integrated circuit according to the other embodiments of the present invention;

FIG. 45 is a plan view illustrating grid areas of the multi-level interconnect in the semiconductor integrated circuit according to the other embodiments of the present invention;

FIG. 46 is a plan view illustrating grid areas of the multi-level interconnect in the semiconductor integrated circuit according to the other embodiments of the present invention;

FIG. 47 is a plan view illustrating grid areas of the multi-level interconnect in the semiconductor integrated circuit according to the other embodiments of the present invention.

DETAILED DESCRIPTION OF THE INVENTION

Figure 2A:
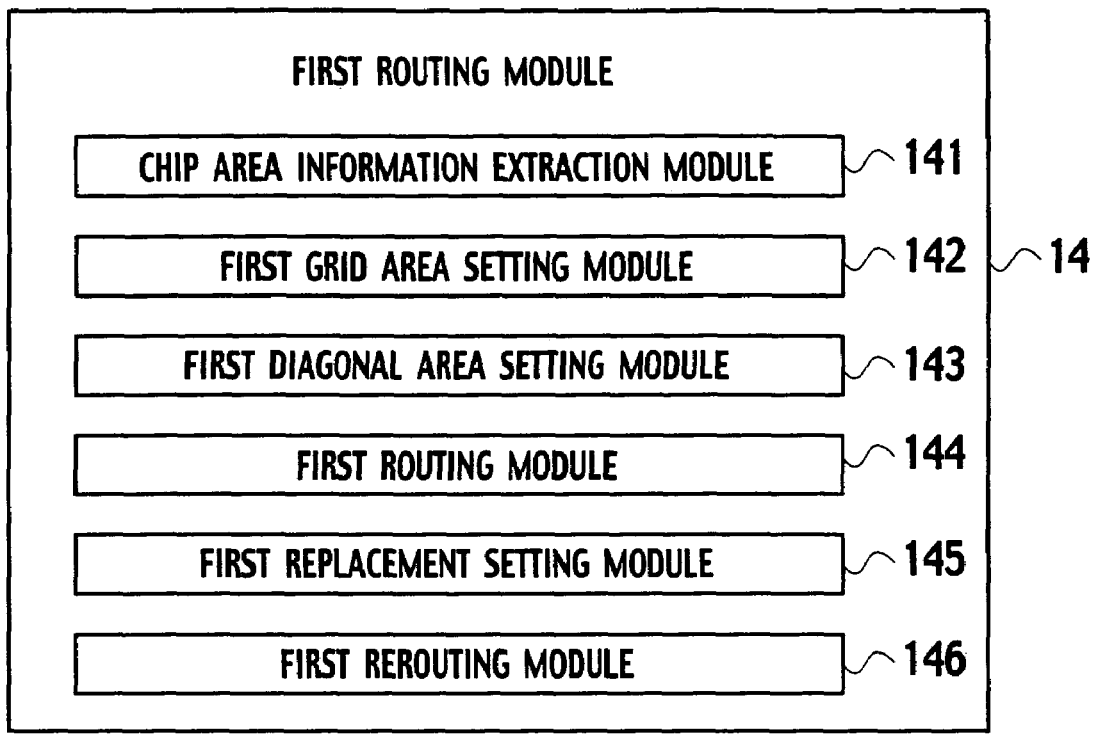
FIG. 2A is a block diagram illustrating a first routing module of the computer automated design system according to the embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous details are set forth such as specific signal values, etc. to provide a thorough understanding of the present invention. However, it will be obvious to those skilled in the art that the present invention may be practiced without such specific details.

—Computer Automated Design System—

As shown in FIG. 1, a computer automated design system according to the embodiment of the present invention includes an input unit 4 which inputs information such as data or instructions from an operator, a central processing unit (CPU) 1, which executes various arithmetic operations for a layout design and the like, an output unit 5 which outputs a layout result and the like, a data memory 2 which stores design information necessary for the layout design of the semiconductor integrated circuit, and a program memory 6 which stores a layout program of the semiconductor integrated circuit, and the like.

The CPU 1 arranges a logic cell, wires and the like on a chip region set in a memory space of the design system. The CPU 1 includes a information extraction module 10, a first routing module 14, a second routing module 15, . . . , a k-th routing module 16, and an (k+1)-th routing module 17, . . . The information extraction module 10 extracts placement information of circuit elements such as cells, macrocells, and megacells placed in the chip area and information necessary to place wires such as power wires, clock wires, and signal wires in each wiring layer from the data memory 2.

The first routing module 14 routes a first wiring layer based on placement information of cells placed in the chip area. As shown in FIG. 2A, the first routing module 14 includes a chip area information extraction module 141, a first grid area setting module 142, a first diagonal grid area setting module 143, a first routing module 144, a first replacement area setting module 145, and a first rerouting module 146.

The chip area information extraction module 141 extracts placement information of circuit elements (macrocells), such as RAM and ROM, which are placed in the chip area. The first grid area setting module 142 reads from the data memory 2 the placement information of circuit elements extracted by the chip area information extraction module 141, a primary direction of interconnect and routing conditions set in advance, and the like. The first grid area setting module 142 then sets a first grid area in a first wiring layer.

For example, as shown in FIG. 3A, the first grid area 401a is composed of a plurality of rectangular areas defined by first grid lines (a first line group) $X_1, X_2, X_3, \ldots, X_{p-1}, X_p, X_{p+1}, \ldots$ and second grid lines (a second line group) $Y_1, Y_2, Y_3, \ldots, Y_{p-1}, Y_p, Y_{p+1}, \ldots$, which are orthogonal to the first grid lines $X_1, X_2, X_3, \ldots, X_{p-1}, X_p, X_{p+1}, \ldots$. The first grid lines $X_1, X_2, X_3, \ldots, X_{p-1}, X_p, X_{p+1}, \ldots$ extend in parallel to the primary direction (a vertical direction in FIG. 3A).

The first diagonal grid area setting module 143 reads the placement information of macrocells extracted by the chip area information extraction module 141, routing information, and the like and then sets first diagonal grid areas 402a, 402b, and 402c in respective areas of the first wiring layer 400a under which macrocells are placed. The first diagonal grid areas 402a, 402b, and 402c are composed of a plurality of rectangular areas defined by third grid lines (a third line group) $S_{p-1}, S_p, S_{p+1}, \ldots$ and fourth grid lines (a fourth line group) $T_{p-1}, T_p, T_{p+1}, \ldots$, which are orthogonal to the third grid lines $S_{p-1}, S_p, S_{p+1}, \ldots$. The third grid lines $S_{p-1}, S_p, S_{p+1}, \ldots$ extend in a direction (the upper right direction in FIG. 3A) rotated clockwise or counterclockwise by 45 degrees with respect to the primary direction in which the first grid lines $X_1, X_2, X_3, \ldots, X_{p-1}, X_p, X_{p+1}, \ldots$ extend. The positions at where the first diagonal grid areas 402a, 402b, and 402c are placed are not limited to the areas above the areas where macrocells are placed and can be certainly set properly according to the purpose or application.

FIG. 3A shows an example when the first diagonal grid areas 402a, 402b, and 402c are placed at areas above the areas where macrocells are placed. Herein, the primary direction of the interconnect of the first wiring layer 400a is the vertical direction in the paper. On the other hand, FIG. 3B shows an example when the primary direction of the interconnect of the first wiring layer 400a is a diagonal direction (the upper right direction in the paper). As apparent from FIGS. 3A and 3B, in boundaries between the first grid area 401a and each of the first diagonal areas 402a, 402b, and 402c, end portions of the first grid lines $X_1, X_2, X_3, \ldots, X_{p-1}, X_p, X_{p+1}, \ldots$ and second grid lines $Y_1, Y_2, Y_3, \ldots Y_{p-1}, Y_p, Y_{p+1}, \ldots$ are connected to respective end portions of the third grid lines $S_{p-1}, S_p, S_{p+1}, \ldots$ and fourth grid lines $T_{p-1}, T_p, T_{p+1}, \ldots$.

The first routing module 144 shown in FIG. 2A routs a plurality of first wires extending in the primary direction and a plurality of first diagonal wires extending diagonally to the plurality of first wires in the first wiring layer 400a based on the first to fourth grid lines $X_{p-1}, X_p, X_{p+1}, \ldots, Y_{p-1}, Y_p, Y_{p+1}, \ldots, S_{p-1}, S_p, S_{p+1}, \ldots, T_{p-1}, T_p, T_{p+1}, \ldots$, which are set by the first grid area setting module 142 and first diagonal grid area setting module 143. The width of the rectangular areas defined by the first to fourth grids $X_{p-1}, X_p, X_{p+1}, \ldots, Y_{p-1}, Y_p, Y_{p+1}, \ldots, S_{p-1}, S_p, S_{p+1}, \ldots, T_{p-1}, T_p, T_{p+1}, \ldots$ can be set to a minimum interval considering placement of vias and the like. However, wires placed on respective grids are not necessarily placed on each of the rectangular areas defined by the first to fourth grid lines $X_{p-1}$, $X_p$, $X_{p+1}$, ..., $Y_{p-1}$, $Y_p$, $Y_{p+1}$, ..., $S_{p-1}$, $S_p$, $S_{p+1}$, ..., $T_{p-1}$, $T_p$, $T_{p+1}$, ... and can be laid in necessary areas as needed.

The first replacement area setting module 145 reads results of routing the first wires and first diagonal wires placed by the first routing module 144 and sets as a first replacement area an area where the wire pitch is narrow and crosstalk may occur. For example, in an area between adjacent macrocells, the wire pitch is set small, and crosstalk is likely to occur. The first replacement area setting module 145 therefore sets, for example, as shown in FIG. 4A, a first replacement area 403a between the first diagonal grid areas 402a and 402b based on an instruction of an operator inputted from the input unit 4. The first replacement area setting module 145 sets a first replacement area 403b between the first diagonal grid areas 402a and 402c and sets a first replacement area 403c between the first diagonal grid areas 402b and 402c. Furthermore, the first replacement area setting module 145 removes wires already existing in the first replacement areas 403a, 403b, and 403c and places a plurality of grid areas defined by fifth grid lines (a fifth line group) $U_{p-1}$, $U_p$, $U_{p+1}$, ... and sixth grid lines (a sixth line group) $V_{p-1}$, $V_p$, $V_{p+1}$, ..., which are orthogonal to the fifth grid lines. The fifth grid lines $U_{p-1}$, $U_p$, $U_{p+1}$, ... extend in a direction rotated clockwise or counterclockwise by 45 degrees with respect to the direction of grid lines of the removed wires.

The first replacement setting module 145 may automatically set the first replacement areas 403a, 403b, and 403c by calculating congestion degree of wires and the like with a layout program stored in the program memory 6 and the like.

Figure 4B:
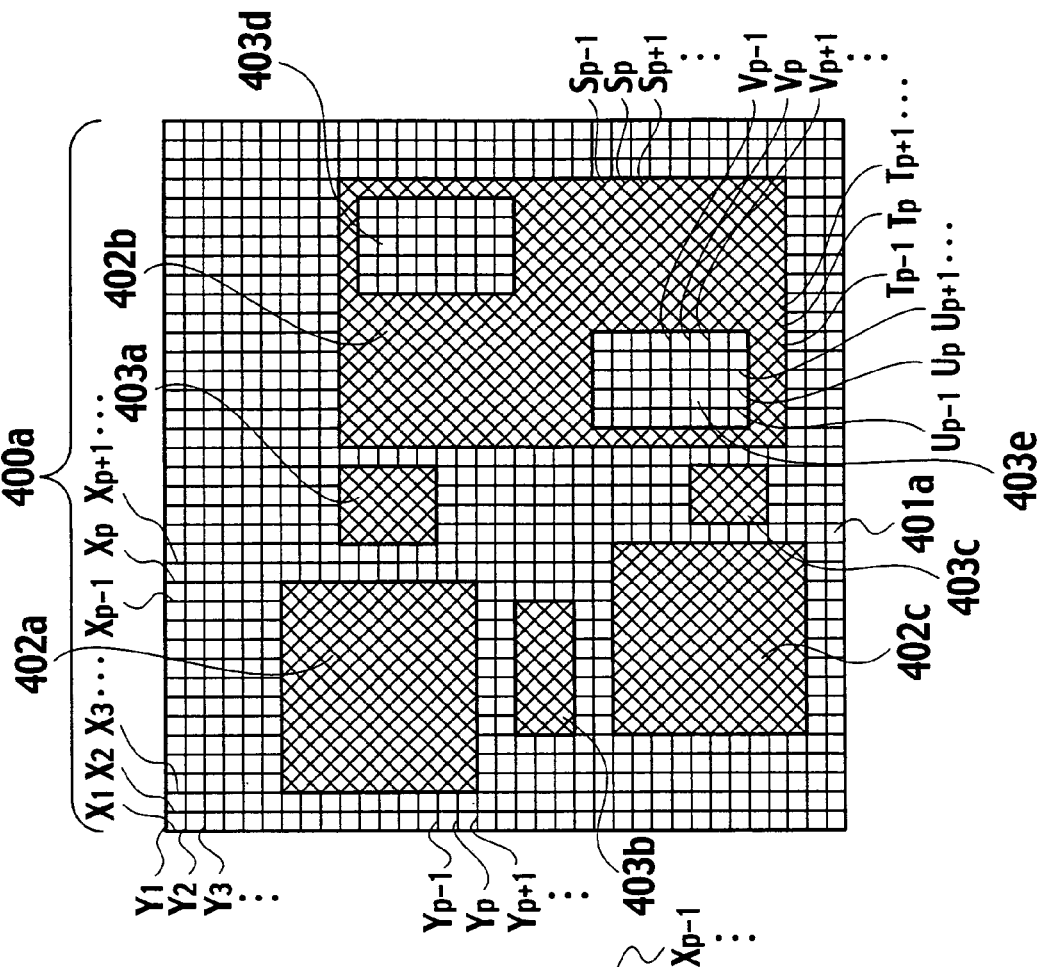
FIGS. 4B is a plan view illustrating a layout of the first layer designed by the computer automated design system according to the first embodiment of the present invention.
Figure 4A:
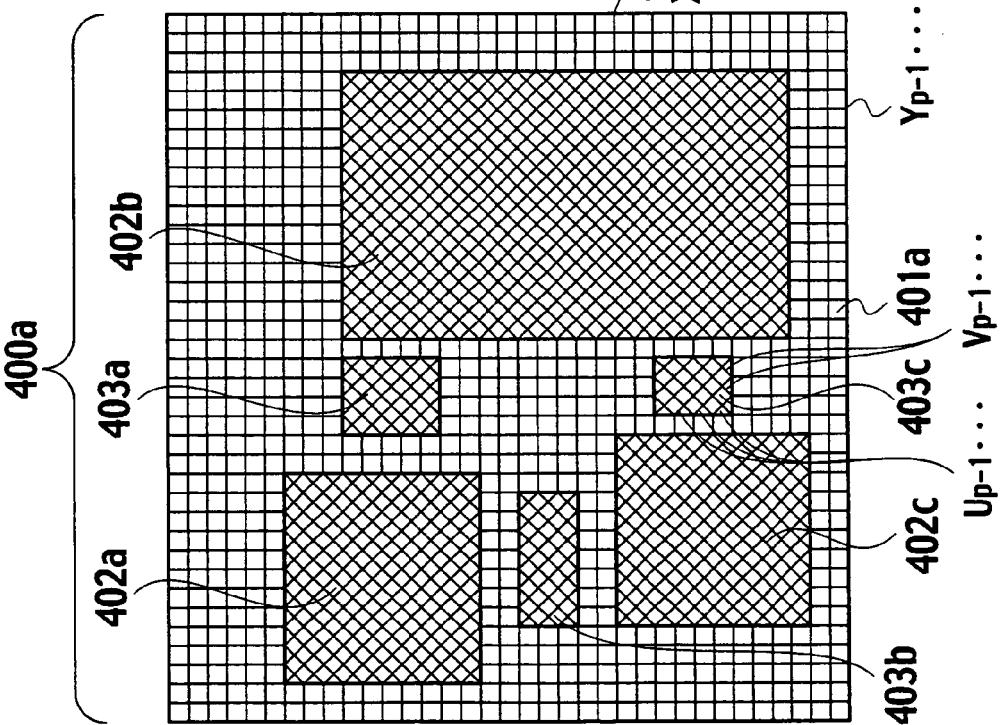
FIGS. 4A is a plan view illustrating a layout of the first layer designed by the computer automated design system according to the first embodiment of the present invention.

For example, as shown in FIG. 4B, the first replacement area setting module 145 can set first replacement areas 403d and 403e in the first diagonal grid area 402b set in the first wiring layer 400a. Furthermore, the first replacement area setting module 145 may remove wires already existing in the first replacement areas 403d and 403e and places a plurality of grid areas defined by the fifth grid lines $U_{p-1}$, $U_p$, $U_{p+1}$, ... and sixth grid lines $V_{p-1}$, $V_p$, $V_{p+1}$, ..., which are orthogonal to the fifth grid lines $U_{p-1}$, $U_p$, $U_{p+1}$, .... The fifth grid lines $U_{p-1}$, $U_p$, $U_{p+1}$, ... extend in a direction rotated by 45 degrees clockwise or counterclockwise with respect to the direction of grid lines of the removed wires. End portions of the fifth grid lines $U_{p-1}$, $U_p$, $U_{p+1}$, ... and sixth grid lines $V_{p-1}$, $V_p$, $V_{p+1}$, ... are connected to respective end portions of the third grid lines $S_{p-1}$, $S_p$, $S_{p+1}$, ... and fourth grid lines $T_{p-1}$, $T_p$, $T_{p+1}$, ... placed in the first diagonal grid area 402b.

Figure 5B:
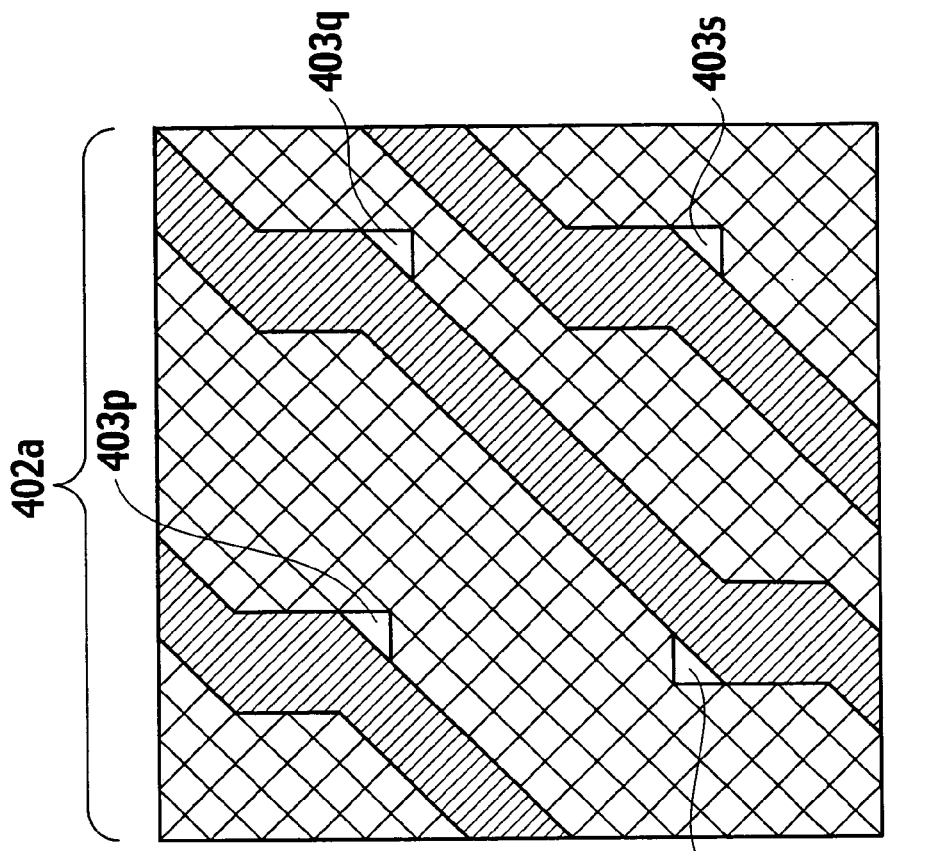
FIGS. 5B is a plan view illustrating detailed layout of the first diagonal grid area as shown in FIGS. 3A-4B.
Figure 5A:
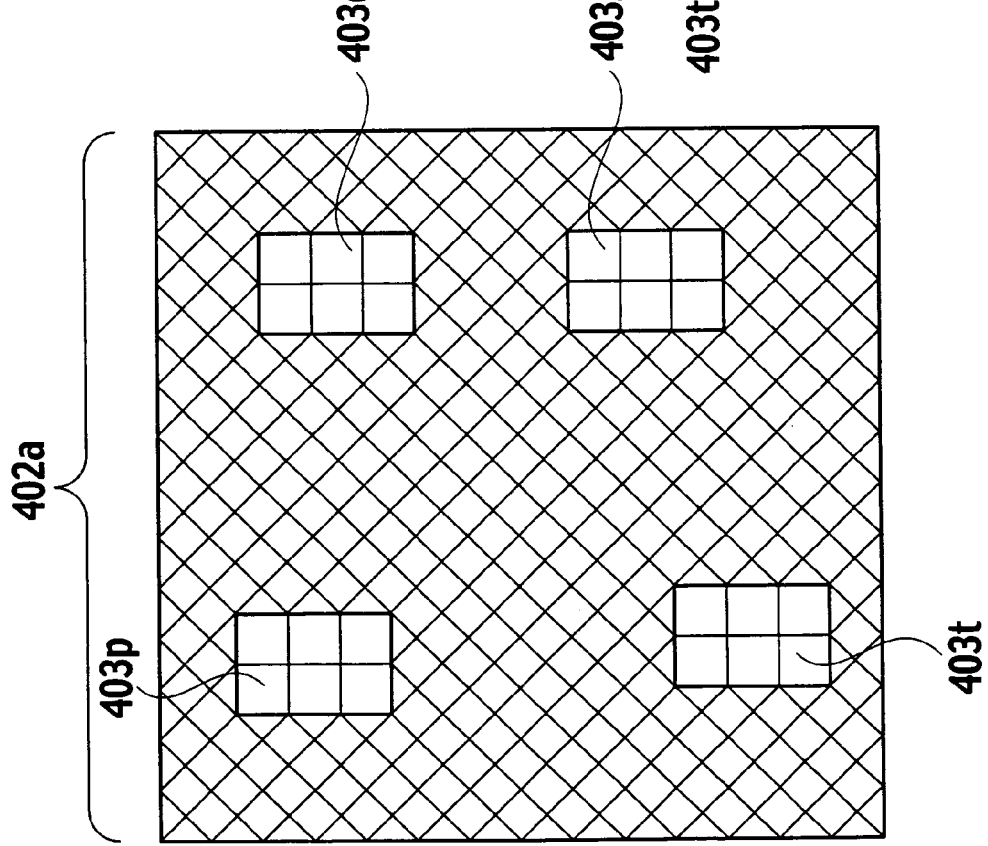
FIGS. 5A is a plan view illustrating detailed layout of the first diagonal grid area as shown in FIGS. 3A-4B.

As shown in FIG. 5A, the first replacement area setting module 145 can set first replacement areas 403p, 403q, 403s, and 403t in respective parts of the first diagonal grid area 402a of FIG. 4B. The first replacement areas 403p, 403q, 403s, and 403t may be arbitrarily set by the operator through the input unit 4 or may be automatically set by the first replacement area setting module 145 calculating the density of wires with the layout program stored in the program memory 6 and the like.

The first rerouting module 146 reroutes a plurality of the first wires extending in the primary direction or a plurality of the first diagonal wires extending diagonally to the first wires in the first wiring layer 400a as shown in FIG. 5B based on the fifth and sixth grid lines $U_{p-1}$, $U_p$, $U_{p+1}$, ..., $V_{p-1}$, $V_p$, $V_{p+1}$, .... The first wires or first diagonal wires are not necessarily rerouted in each rectangular area defined by the fifth and sixth grid lines $U_{p-1}$, $U_p$, $U_{p+1}$, ... $V_{p-1}$, $V_p$, $V_{p+1}$, ... and, as apparent from FIG. 5B, can be placed in necessary areas on the fifth and sixth grid lines $U_{p-1}$, $U_p$, $U_{p+1}$, ..., $V_{p-1}$, $V_p$, $V_{p+1}$, ... as needed.

Figure 6:
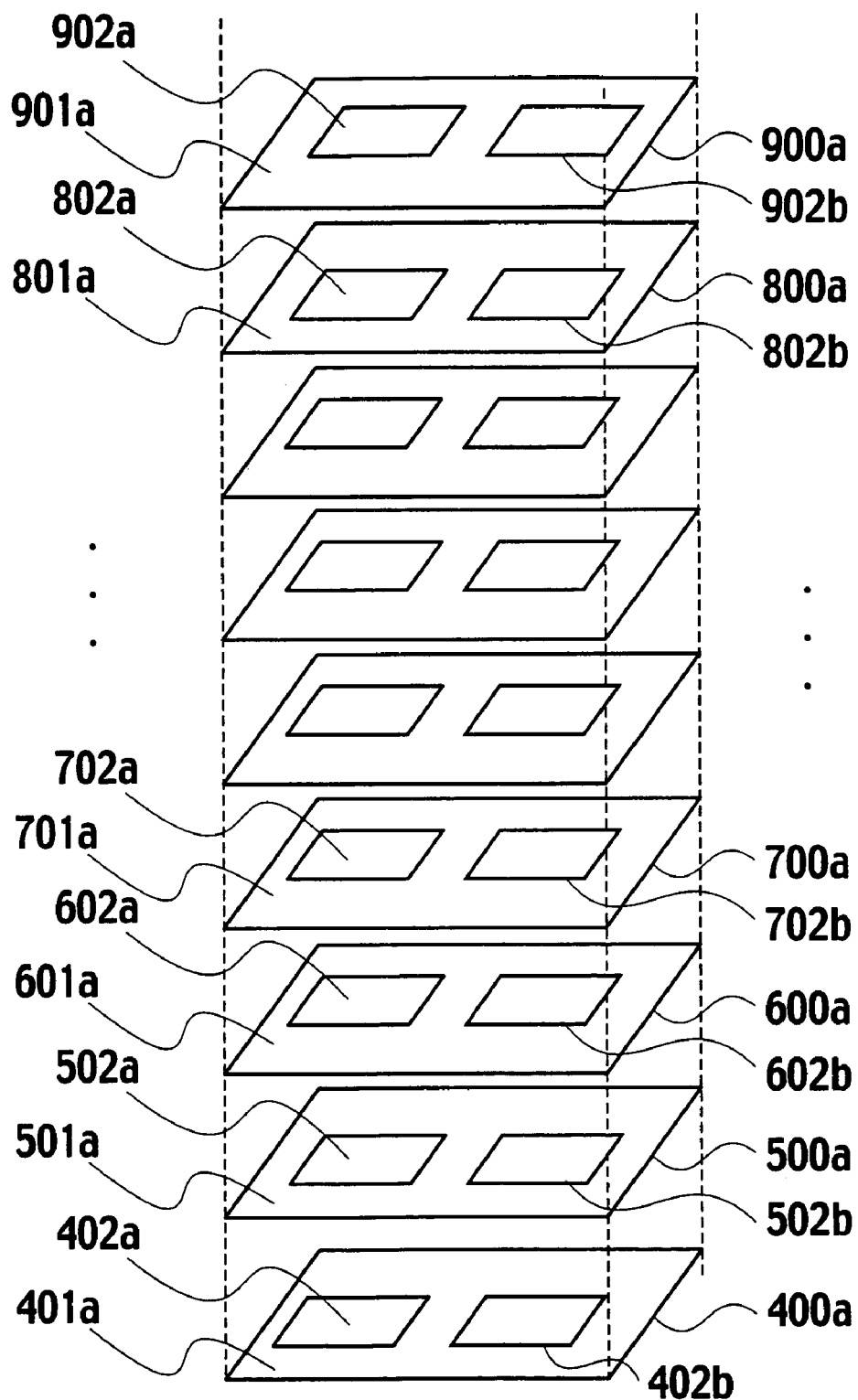
FIG. 6 is a schematic diagram illustrating a multi-level interconnect of the semiconductor integrated circuit designed by the computer automated design system according to the embodiment of the present invention.

The second routing module 15, for example, as shown in FIG. 6, places wires in a second wiring layer based on position information of the first grid area 401a, first diagonal grid areas 402a and 402b, and the like of the first wiring layer 400a. In a similar way, wires in third, fourth, and fifth wiring layers are also placed based on information on lower layers. Operations to place wires in the second, third, fourth, fifth, ... layers are substantially similar to each other, and details thereof are described with the (k+1)-th routing module 17 performing routing of the topmost layer.

Figure 2B:
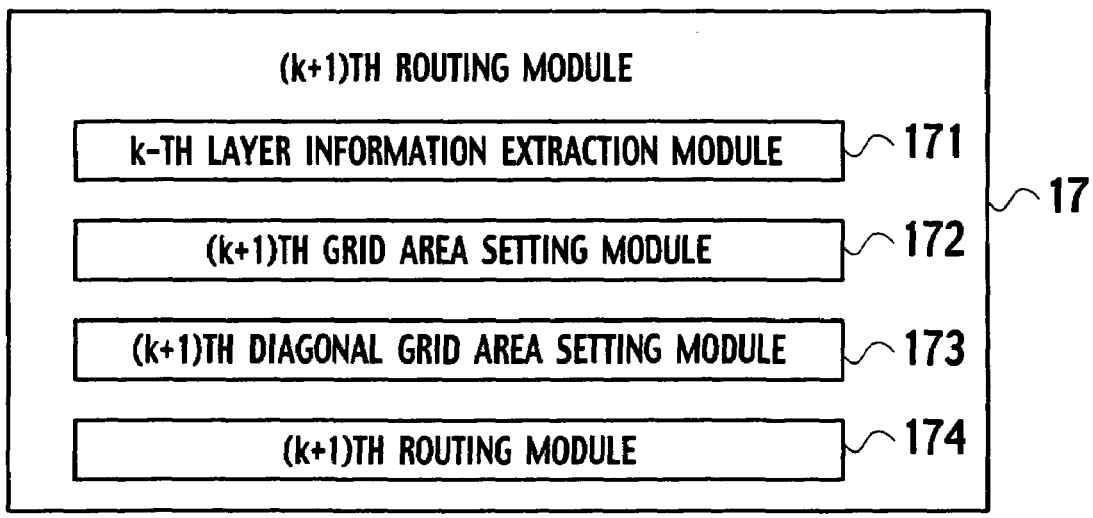
FIG. 2B is a block diagram illustrating a (k+1)-th routing module of the computer automated design system according to the embodiment of the present invention.

As shown in FIG. 2B, the (k+1)-th routing module 17 shown in FIG. 1 includes a k-th layer information extraction module 171, a (k+1)-th grid area setting module 172, a (k+1)-th diagonal grid area setting module 173, and a (k+1)-th routing module 174.

As shown in FIG. 6, the k-the layer information extraction module 171, extracts position information of a k-th grid area 801a and k-th diagonal grid areas 802a and 802b of a k-th wiring layer 800a. The (k+1)-th grid area setting module 172 reads from the data memory 2 information of the grid areas of the k-th wiring layer 800a extracted by the k-th layer information extraction module 171, the primary direction of the interconnect, the routing conditions, and the like and then sets a (k+1)-th grid area 901a right above the k-th grid area 801a such that the (k+1)-th grid area 901a and the k-th grid area 801a overlap each other. In a similar way, the (k+1)-th diagonal grid area setting module 173 reads from the data memory 2 information of the grid areas of the k-th wiring layer 800a extracted by the k-th layer information extraction module 171, the primary direction of the interconnect, the routing conditions, and the like and then sets (k+1)-th diagonal grid areas 902a and 902b right above the k-th diagonal grid areas 802a and 802b such that the (k+1)-th diagonal grid area 902a and 902b and the k-th diagonal grid areas 802a and 802b overlap each other, respectively. The (k+1) routing module 174 reads from the data memory 2 the information of the grid areas set by the (k+1)-th grid area setting module 172 and (k+1)-th diagonal grid area setting module 173 and places a plurality of (k+1)-th wires and a plurality of (k+1)-th diagonal wires in a (k+1)-th wiring layer 900a. The plurality of (k+1)-th wires extend in parallel to the primary direction, and the plurality of (k+1)-th diagonal wires extend in the direction rotated clockwise or counterclockwise by 45 degrees with respect to the direction in which the plurality of (k+1)-th wires extend.

Referring back to FIG. 1, the data memory 2 includes a cell information file 21, a routing information file 22, a first layer information file 24, a second layer information file 25, ..., a k-th layer information file 26, a (k+1)-th layer information file 27. ... The cell information file 21 stores information including shapes, sizes, positions, and circuits of cells, macrocells, and megacells placed in the chip area. The routing information file 22 stores routing information necessary to form multi-level interconnect, connection information of circuits, and the like. The first layer information file 24 stores various types of information necessary to place the first wiring layer 400a on the chip area. The (k+1)-th layer information file 27 stores various types of information necessary to place the upper (k+1) wiring layer 900a on the k-th wiring layer 800a.

The input unit 4 includes a keyboard, a mouse, a light pen, a flexible disk, and the like. The operator can input design data through the input unit 4. It is also possible to input installation of layout parameters, calculations, cancellations. The display unit 5 displays input and output data, layout results and the like. The output unit 5 includes a display, a printer, and recording equipment, which record data to a computer readable recording media. The program memory 6 stores input and output data, layout program, and the like.

With the computer automated design system according to the embodiment, the rectangular areas (the first diagonal grid area 402a, first replacement area 403a, and the like) to place the diagonal wires are set in areas where the wire pitch is small and crosstalk may occur, and the rectangular area (the first grid area 401a) to place the orthogonal wires is set in the other area, which is apparent from a later-described automated design method. Since the wire lengths of the diagonal wires have square root of two times shorter than the orthogonal wires in the same wiring area, electric power consumption and crosstalk may be decreased. Since providing the diagonal wires can reduce the wiring area by 30% in comparison with the orthogonal wires, the semiconductor integrated circuit with higher integration can be achieved. Particularly, the computer automated design system may be suitable for designing the semiconductor integrated circuit having multi-level interconnect of 4-20 layers or 9-12 layers. Furthermore, with the computer automated design system according to the embodiment, the first diagonal grid areas 402a and 402b can be previously set by the first diagonal grid setting module 143 in areas where circuit elements such as RAM, ROM, and DSP are placed and crosstalk may occur based on the information of the chip area. It is therefore possible to design a semiconductor integrated circuit in which occurrence of crosstalk can be further suppressed.

As shown in the conceptual diagram of FIG. 6, when automated routing is performed using the computer automated design system according to the embodiment, the first grid area 401a and first diagonal grid areas 402a and 402b are placed in the first wiring layer 400a. In the second wiring layer 500a, a second grid area 501a is placed in an area right above the first grid area 401a so as to overlap the first grid area 401a, and second diagonal grid areas 502a and 502b are placed in areas right above the first diagonal grid areas 402a and 402b so as to overlap the first diagonal grid areas 402a and 402b, respectively. In a third wiring layer 600a, a third grid area 601a is placed in an area right above the second grid area 501a so as to overlap the second grid area 501a, and third diagonal grid areas 602a and 602b are placed in areas right above the second diagonal grid areas 502a and 502b so as to overlap the second diagonal grid areas 502a and 502b, respectively. In a fourth wiring layer 700a, a fourth grid area 701a is placed in an area right above the third grid area 601a so as to overlap the third grid area 601a, and fourth diagonal grid areas 702a and 702b are placed in areas right above the third diagonal grid areas 602a and 602b so as to overlap the third diagonal grid areas 602a and 602b, respectively. In the k-th wiring layer 800a, the k-th grid area 801a is placed in an area right above a (k−1)-th grid area so as to overlap the (k−1)-th grid area, and k-th diagonal grid areas 802a and 802b are placed in areas right above the (k−1)-th diagonal grid areas so as to overlap the (k−1)-th diagonal grid areas, respectively.

As described above, with the automated design system according to the embodiment, the first diagonal grid areas 402a and 402b, the second diagonal grid areas 502a and 502b, . . . , (k+1)-th diagonal grid areas 902a and 902b to place the diagonal wires are placed in all the respective layers on the chip area so as to overlap each other. The first grid area 401a, second grid area 501a, . . . , (k+1)-th grid area 901a to place the orthogonal wires are placed in respective layers so as to overlap each other. The positions of the first to sixth grid lines $X_{p-1}, X_p, X_{p+1}, \ldots, Y_{p-1}, Y_p, Y_{p+1}, \ldots, S_{p-1}, S_p, S_{p+1}, \ldots, T_{p-1}, T_p, T_{p+1}, \ldots, U_{p-1}, U_p, U_{p+1}, \ldots, V_{p-1}, V_p, V_{p+1}, \ldots$ placed in each layer therefore match those in another layer. Accordingly, there is no displacement generated between the grid points to place the orthogonal wires and the grid points to place the diagonal wires. Even in the case of forming finer and multi-level interconnect, the problem of restriction of placement positions of via holes due to the displacement between the grid points is not caused, thus facilitating interconnect design.

—Computer Automated Design Method—

Figure 7:
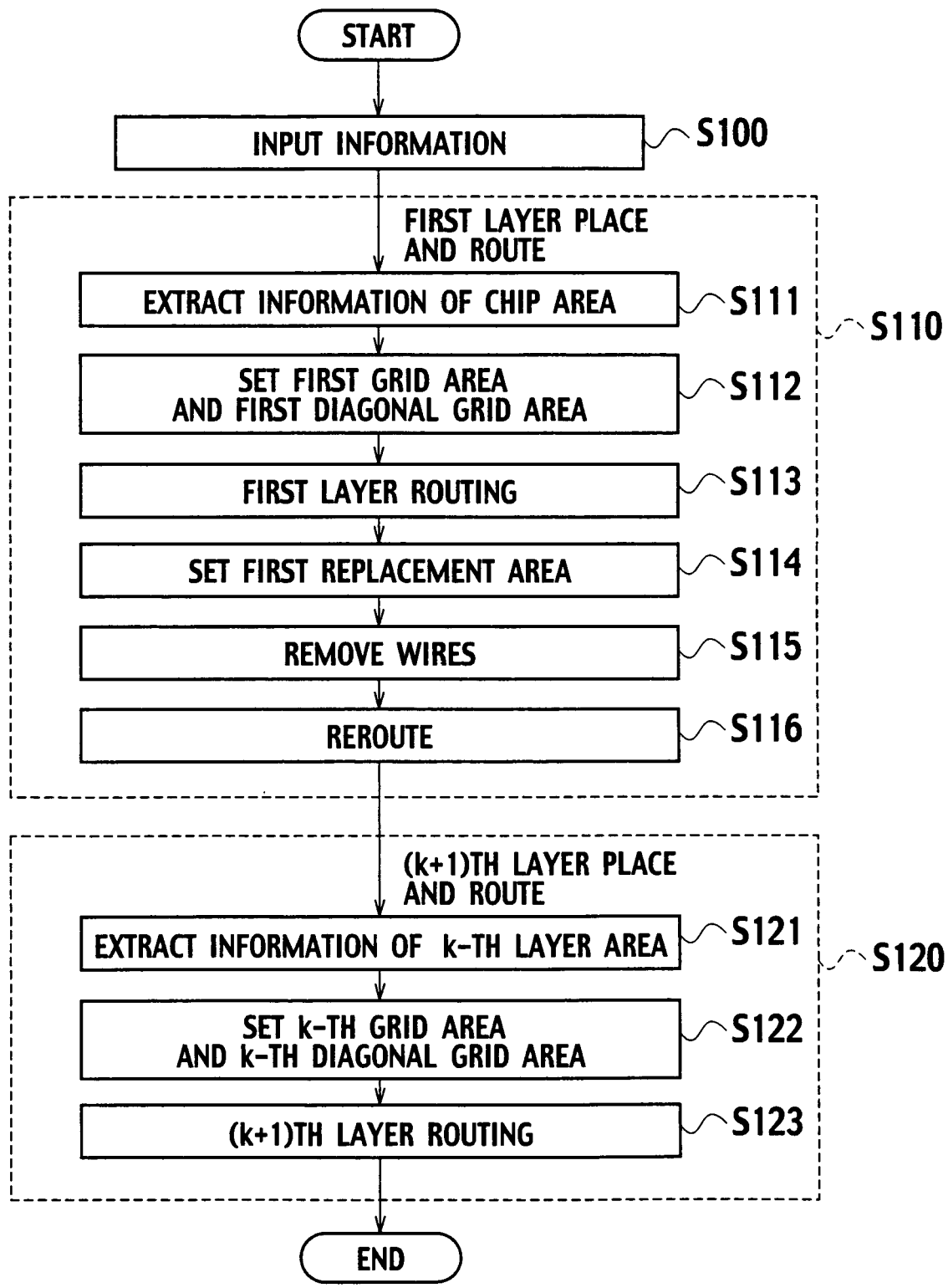
FIG. 7 is a flowchart illustrating a computer automated design method according to the embodiment of the present invention.

A description is given of the automated design method according to the embodiment using a flowchart of FIG. 7.

In step S100, the information extraction module 10 shown in FIG. 1 extracts various types of information including cell information, routing information, and the like necessary for interconnect design of a semiconductor integrated circuit. The cell information (circuit information) of cells, macrocells, and megacells placed in the chip area is stored in the cell information file 21 through the input unit 4. The routing conditions and the like to form a multi-level interconnect on the chip area are stored in the routing information file 22 through the input unit 4.

In step S110, interconnect of the first wiring layer 400a shown in FIG. 1 is designed. In step S111, the chip area information extraction module 141 of FIG. 2A extracts circuit information of the chip area stored in the cell information file 21. The detailed structure of the semiconductor integrated circuit is not particularly limited. For example, the semiconductor integrated circuit may be an ASIC such as NAND, NOR, AND, DRAM, LOGIC, and DRAM embedded LOGIC and may be a programmable device (PLD) such as FPGA and CPLD. Furthermore, the semiconductor integrated circuit can include an ASIC and a PLD mixed.

In step S112, the first grid area setting module 142 reads the circuit information extracted by the chip area information extraction module 141 and the routing information stored in the routing information file 22 and, as shown in FIG. 4A, sets the first grid area 401a, which is composed of a plurality of rectangular areas defined by the first grid lines $X_1, X_2, X_3, \ldots, X_{p-1}, X_p, X_{p+1}, \ldots$ and second grid lines $Y_1, Y_2, Y_3, \ldots, Y_{p-1}, Y_p, Y_{p+1}, \ldots$, in the first wiring layer 400a. The first diagonal grid area setting module 143 reads the cell information extracted by the chip area information extraction module 141, the routing information, and the like and, as shown in FIG. 4A, sets the first diagonal grid areas 402a, 402b, and 402c, each of which is composed of a plurality of rectangular areas defined by the third grid lines $S_{p-1}, S_p, S_{p+1}, \ldots$ and fourth grid lines $T_{p-1}, T_p, T_{p+1}, \ldots$, in the first wiring layer 400a. For example, when macrocells requiring areas of certain sizes, such as RAM and ROM, are set under the first wiring layer 400a and the diagonal wires are desired to be set right above the areas where RAM, ROM, and the like are placed, the first diagonal grid area setting module 143 sets the first diagonal grid areas 402a, 402b, and 402c right above the areas where RAM, ROM, and the like are placed.

In step S113, the first routing module 144 routes a plurality of first wires (not shown) extending in the primary direction and a plurality of the first diagonal wires extending diagonally to the first wires in the first wiring layer 400a based on the first to fourth grid lines $X_{p-1}, X_p, X_{p+1}, \ldots, Y_{p-1}, Y_p, Y_{p+1}, \ldots, S_{p-1}, S_p, S_{p+1}, \ldots, T_{p-1}, T_p,$ $T_{p+1}, \ldots$ set by the first grid area setting module 142 and first diagonal grid area setting module 143.

In step S114, as shown in FIG. 4A or 4B, the first replacement area setting module 145 sets the first replacement areas 403a, 403b, 403c, 403d, 403e, . . . in areas where crosstalk may occur. The first replacement areas 403a, 403b, 403c, 403d, 403e, . . . can be set by an instruction from the operator through the input unit 4 based on calculation results of probability of occurrence of crosstalk and the like or can be automatically performed by the first replacement area setting module 145.

In step S115, the first replacement area setting module 145 removes the plurality of first wires or first diagonal wires in the first replacement areas 403a, 403b, 403c, 403d, 403e, . . ., which are routed by the first routing module 144, and places a plurality of rectangular areas in the first replacement areas 403a, 403b, 403c, 403d, 403e, . . . to reroute the removed wires in the areas with the wires removed. The placed rectangular areas are defined by the fifth and sixth grid lines $U_{p-1}, U_p, U_{p+1}, \ldots, V_{p-1}, V_p, V_{p+1}, \ldots$. In step S116, in the first wiring layer 400a, the first rerouting module 146 reroutes either a plurality of the first wires or first diagonal wires extending diagonally to the first wires based on the fifth and sixth grid lines $U_{p-1}, U_p, U_{p+1}, \ldots, V_{p-1}, V_p, V_{p+1}, \ldots$. The routing information of the first wiring layer 400a is stored in the first layer information file 24 of FIG. 1.

In step S120, interconnect of the (k+1)-th wiring layer 900a above the first wiring layer 400a is designed. In step S121, the k-th layer information extraction module 171 extracts information of the k-th grid area 801a stored in the k-th layer information file 26. In step S122, the (k+1)-th grid area setting module 172 reads the information of the wiring areas extracted by the k-th layer information extraction module 171, the primary direction of the interconnect and routing conditions stored in the routing information file 22, and the like and, as shown in FIG. 6, sets the (k+1)-th grid area 901a right above the k-th grid area 801a. The (k+1)-th diagonal grid area setting module 173 reads the routing information extracted by the k-th layer information extraction module 171, the routing conditions stored in the routing information file 22, and the like and sets the (k+1)-th diagonal grid areas 902a and 902b right above the k-th diagonal areas 802a and 802b, respectively.

In step S123, the (k+1)-th routing module 174 places a plurality of (k+1)-th wires (not shown) extending in parallel to the primary direction and a plurality of (k+1)-th diagonal wires (not shown) in the (k+1)-th wiring layer 900a based on the information of the wiring areas set by the (k+1)-th grid area setting module 172 and (k+1)-th diagonal grid area setting module 173. Herein, the (k+1)-th diagonal wires extend in the direction rotated clockwise or counterclockwise by 45 degrees with respect to the direction in which the (k+1)-th wires extend. The routing result is stored in the (k+1)-th layer information file 27.

With the automated design method according to the embodiment, as exemplified in FIG. 6, the second diagonal grid areas 502a and 502b, . . ., and k-th diagonal grid areas 902a and 902b are placed in all the respective first to (k+1)-th wiring layers 400a to 900a so as to overlap respectively with the first diagonal grid areas 402a and 402b in which the diagonal wires are placed. It is therefore possible to align the first to sixth grid lines $X_{p-1}, X_p, X_{p+1}, \ldots, Y_{p-1}, Y_p, Y_{p+1}, \ldots, S_{p-1}, S_p, S_{p+1}, \ldots, T_{p-1}, T_p, T_{p+1}, \ldots, U_{p-1}, U_p, U_{p+1}, \ldots, V_{p-1}, V_p, V_{p+1}, \ldots$ placed in respective wiring layers. By the alignment of the placement positions, the problem of restricting the placement of via holes due to the misalignment of the grid lines can be reduced. Accordingly, the interconnect design can be facilitated even in finer and multi-level interconnect. Furthermore, setting the rectangular areas to set the diagonal wires in each wiring layer can decrease wiring area compared to the case of using only the orthogonal interconnect. It is thus possible to increase the wiring efficiency of the semiconductor integrated circuit and thus achieve the higher density thereof.

—Semiconductor Integrated Circuit—

Figure 8:
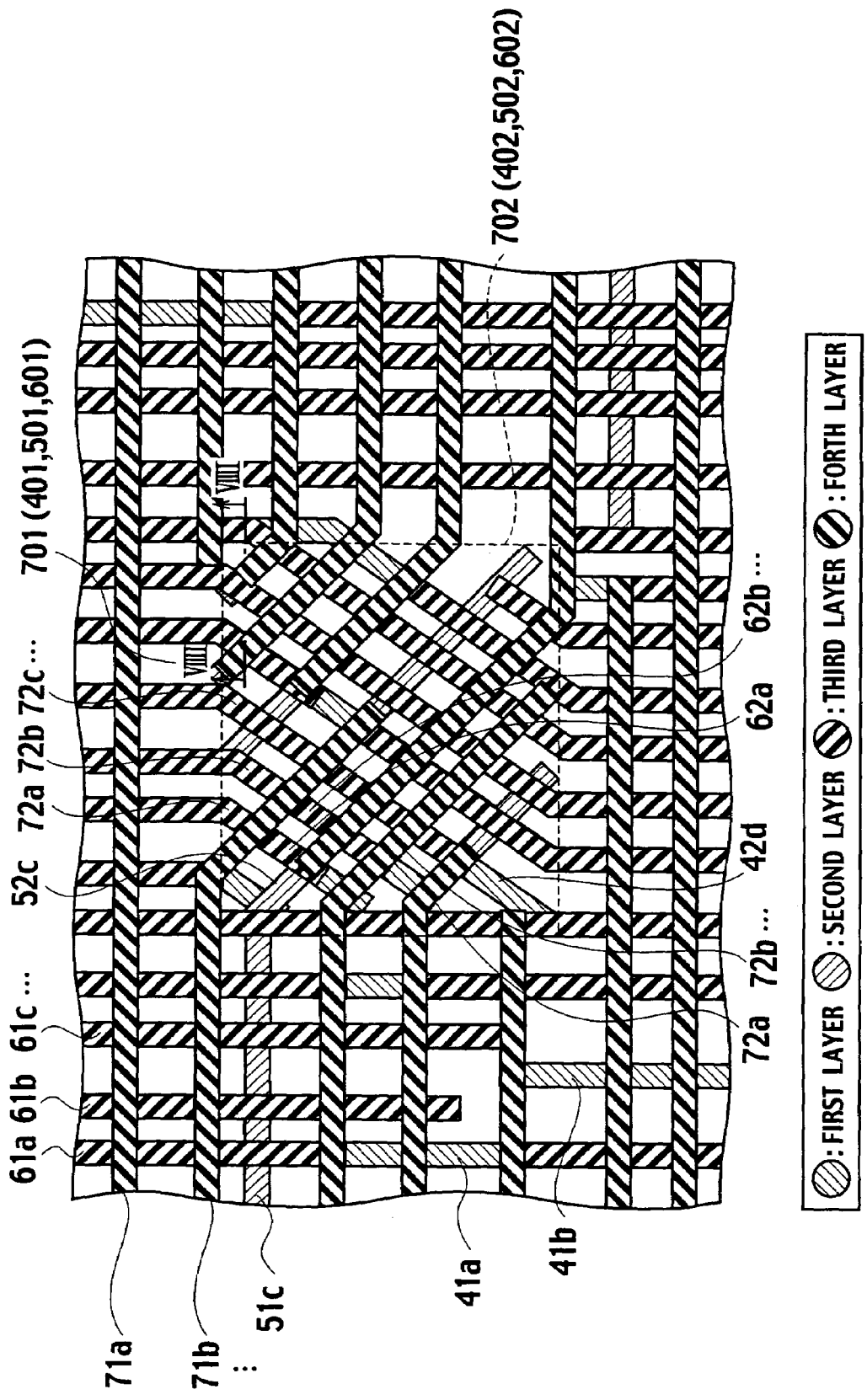
FIG. 8 is a plan view illustrating a semiconductor integrated circuit designed by the computer automated design method according to the embodiment of the present invention.
Figure 9:
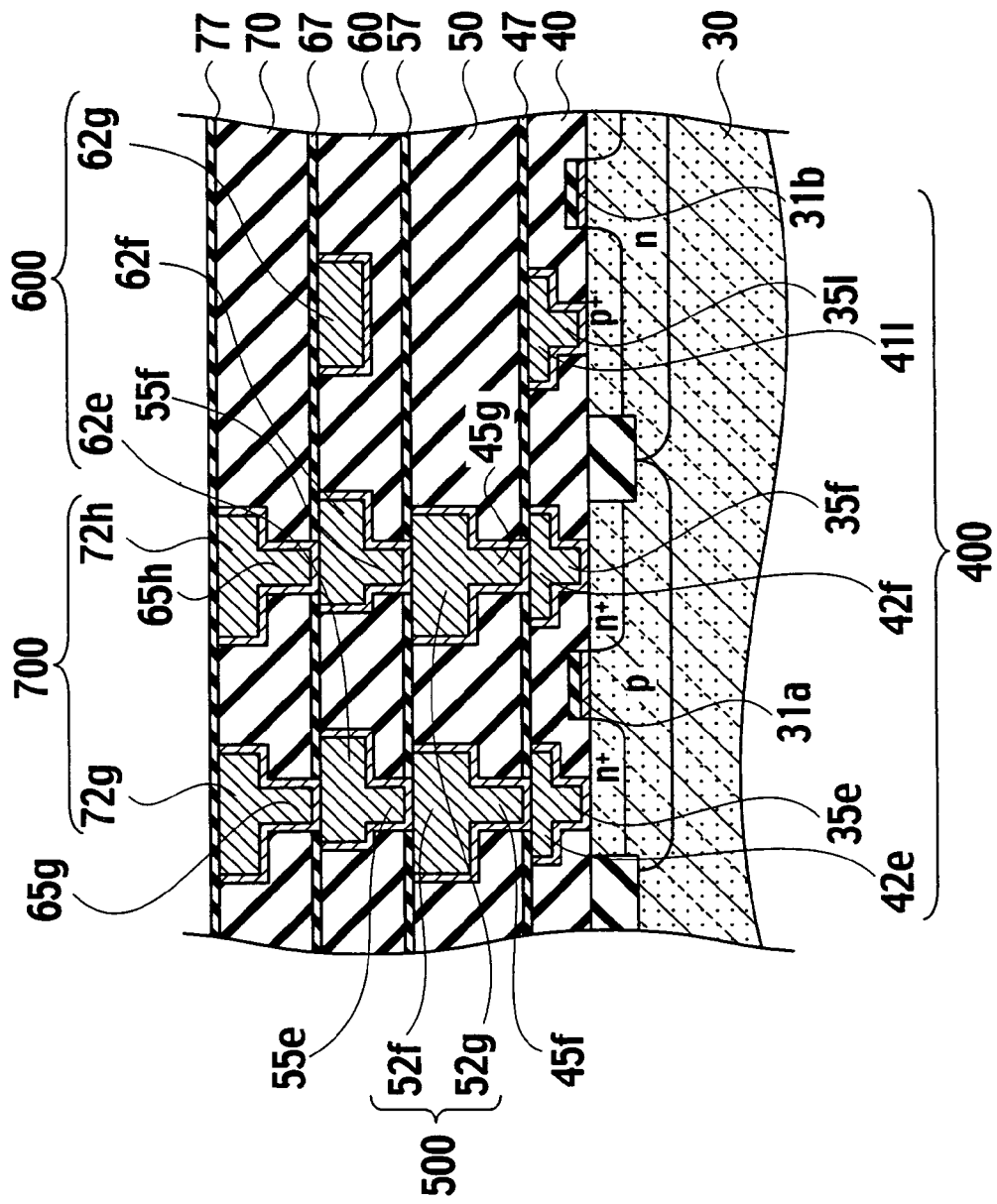
FIG. 9 is a cross-sectional view taken on line VIIII-VIIII in FIG. 8.

Next, an example of the semiconductor integrated circuit which can be manufactured using the computer automated design method according to the embodiment is shown in a plan view of FIG. 8 and in a cross-sectional view of FIG. 9. As shown in FIG. 9, the semiconductor integrated circuit includes a substrate 30, a plurality of elements 31a and 31b on the substrate 30, and a first insulating film 40 on the plurality of elements 31a and 31b. The first insulating film 40 is provided with a first wiring layer 400 including a first grid area 401 and a first diagonal grid area 402. The first grid area 401 includes a plurality of first wires 41a, 41b, . . . 41l, . . . extending in parallel to a first primary direction. The first diagonal grid area 402 includes a plurality of first diagonal wires 42d, 42e, 42f, . . . connected to the first wires 41a, 41b, . . ., 41l, . . . and extended diagonally to the first primary direction.

The first wire 411 is electrically connected to the element 31b on the substrate 30 through a first via plug 351 buried in the first insulating film 40. The first diagonal wires 42d and 42f are electrically connected to the element 31a through first via plugs 35e and 35f buried in the first insulating film 40. A first stopper film 47 is provided on the first wiring 411, the first diagonal wires 42e and 42f, and the first insulating film 40.

A second insulating film 50 is provided on the first stopper film 47. A second wire, which is not shown in the cross-sectional view of FIG. 9, and second diagonal wires 52f and 52g connected to the second wire are provided on the second insulating film 50. The second diagonal wires 52f and 52g are connected to the first diagonal wires 42e and 42f through second via plugs 45f and 45g buried in the second insulating film 50. A second stopper film 57 is provided on the second diagonal wires 52f and 52g, and the second insulating film 50.

A third insulating film 60 is provided on the second stopper film 57. A third wire, which is not shown in the cross-sectional view of FIG. 9, third diagonal wires 62e and 62f and a third wire 62g are provided in the third insulating film 60. The third diagonal wires 62e and 62f are connected to the second diagonal wires 52f and 52g through third via plugs 55e and 55f buried in the third insulating film 60. A third stopper film 67 is provided on the third diagonal wires 62e and 62f, the third wire 62g and the third insulating film 60.

A fourth insulating film 70 is provided on the third stopper film 67. A fourth wire, which is not shown in the cross-sectional view of FIG. 9, and fourth diagonal wires 72g and 72h connected to the fourth wire are provided in the fourth insulating film 70. The fourth diagonal wires 72g and 72h are connected to the third diagonal wires 62e and 62f through fourth via plugs 65g and 65h buried in the fourth insulating film 70. A fourth stopper film 77 is provided on the fourth diagonal wires 72g and 72h and the fourth insulating film 70.

The material of the first to fourth wires 41a, 41b, . . ., 71a, 71b, . . ., the first to fourth diagonal wires 42a, 42b, . . ., 72a, 72b, . . ., and first to fourth via plugs 35e, 35f, . . ., 65g, 65h, . . . can be aluminum (Al), copper (Cu), Al—Cu, Al-silicon (Si)—Cu, silver (Ag), gold (Au), or the like. The first to fourth insulating films 40, 50, 60, and 70 can be low-dielectric constant insulating films (low-k films) with a relative dielectric constant of below 3.0. As such low-dielectric insulating films, organic silicon oxide films of polysiloxane, benzocyclobutene (BCB), and the like; inorganic silicon oxide films of hydrogen-silsesquioxane and the like; carbon fluoride (CF) films of polyallylene ether, parylene, polyimide fluoropolymer, and the like; and the like may be suitable.

In the semiconductor integrated circuit according to the embodiment, the diagonal wires (the first to fourth diagonal wires 42a, 42b, . . . , 72a, 72b, . . . ) are placed in areas where crosstalk may occur. The wire pitch can be therefore increased without violating the design rule, thus reducing error operations of the semiconductor integrated circuit caused by crosstalk between wires. Furthermore, the areas where the diagonal wires are placed are disposed in each of the wiring layers on the substrate 30 so as to overlap and correspond to each other. This can reduce the misalignment of vias even in the multi-level interconnect.

—A Method of Manufacturing a Semiconductor Integrated Circuit—

A method of manufacturing a semiconductor integrated circuit according to the embodiment of the present invention is described. The method of manufacturing the semiconductor integrated circuit to be described below is an example. Thus, it is needless to say that the present invention can be achieved by use of various other manufacturing methods including a modified example of the one described below.

Figure 10:
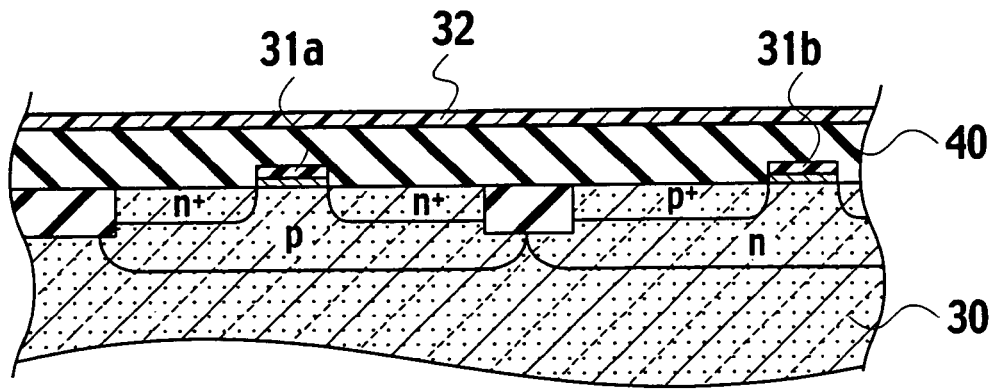
FIG. 10 is a cross-sectional view illustrating a method of manufacturing the semiconductor integrated circuit according to the embodiment of the present invention.

As shown in FIG. 10, the first insulating film 40 made from $SiO_2$ film may be formed on a plurality of the elements 31a and 31b on the substrate 30. A photoresist film 32 is spin-coated on the surface of the first insulating film 40 and then delineated by use of a photolithography process. Part of the first insulating film 40 is selectively stripped by reactive ion etching (RIE) using the delineated photoresist film 32 as an etching mask to form trenches 33e, 33f, and 33l and via holes.

Figure 11:
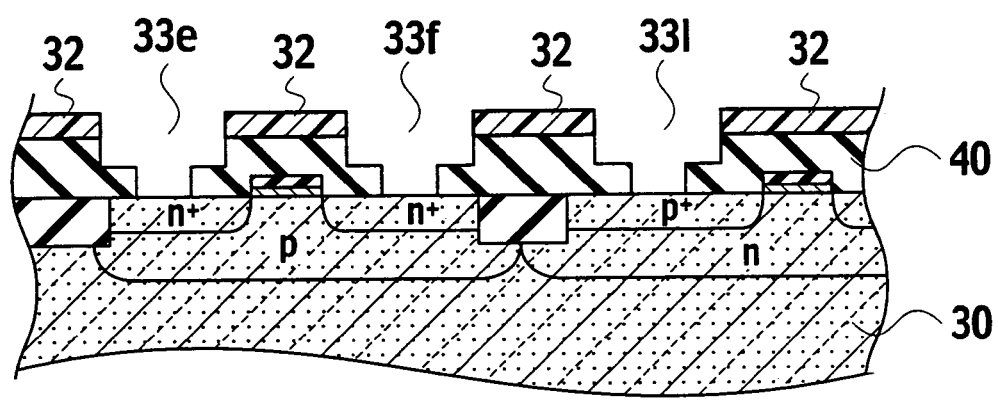
FIG. 11 is a cross-sectional view illustrating the method of manufacturing the semiconductor integrated circuit according to the embodiment of the present invention.
Figure 12:
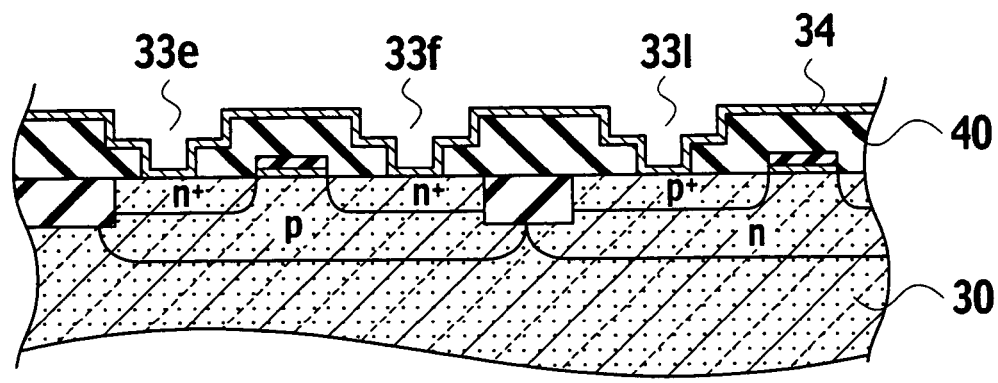
FIG. 12 is a cross-sectional view illustrating the method of manufacturing the semiconductor integrated circuit according to the embodiment of the present invention.

As shown in FIG. 11, the photoresist film 32 is removed. As shown in FIG. 12, a barrier metal 34 is deposited by CVD on the surface of the first insulating film 40 and the trenches 33e, 33f, and 33l. For the barrier metal 34, tungsten (W), titan silicon (TiSi), cobalt silicon (CoSi), nickel (N), NiSi, iron silicon (FeSi) aluminum (Al), Al—Si—Cu, Al—Si, Al—Cu, Ag, Au, or laminated films using these materials are suitable for use.

Figure 13:
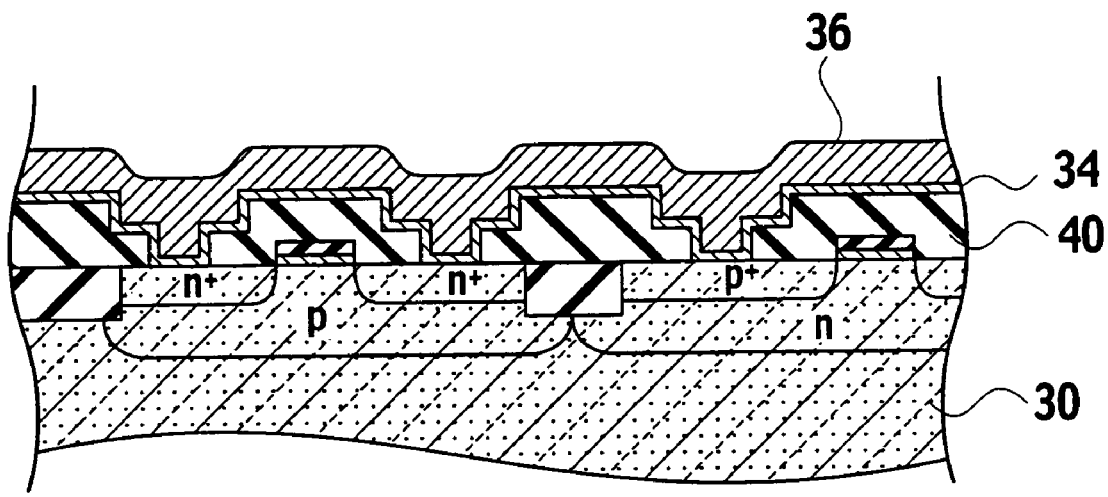
FIG. 13 is a cross-sectional view illustrating the method of manufacturing the semiconductor integrated circuit according to the embodiment of the present invention.
Figure 14:
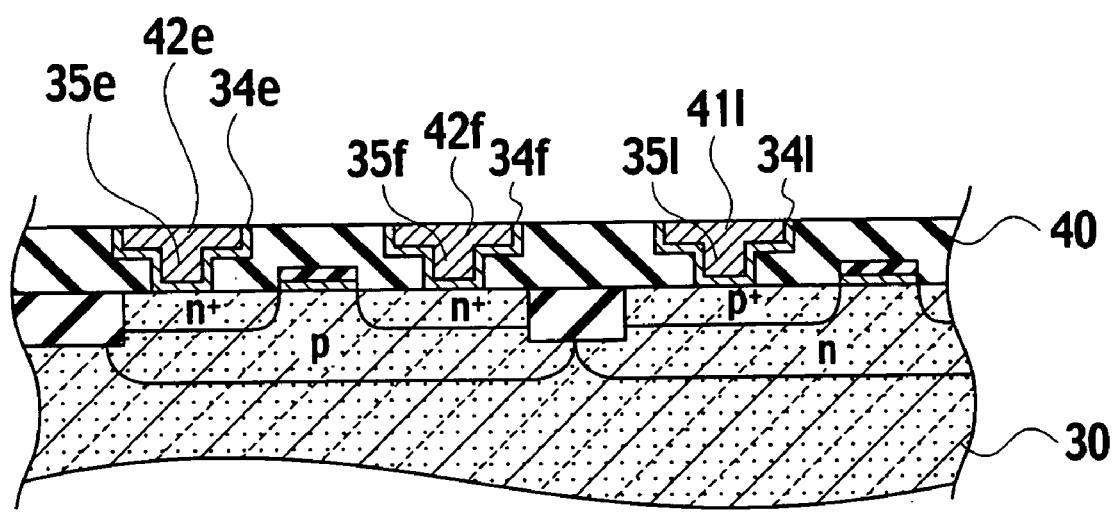
FIG. 14 is a cross-sectional view taken online XIV-XIV in FIG. 15.
Figure 15:
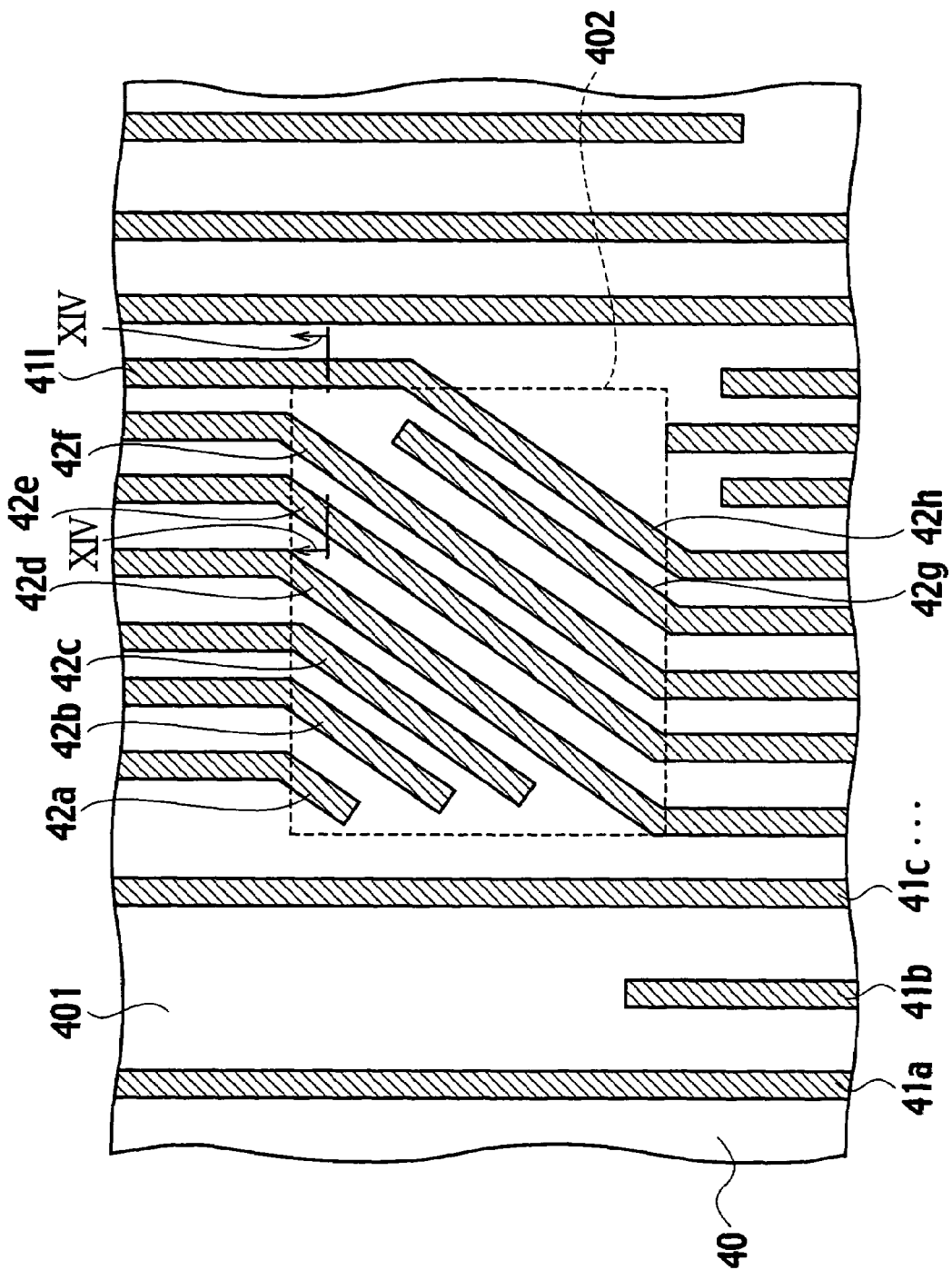
FIG. 15 is a plan view illustrating the method of manufacturing the semiconductor integrated circuit according to the embodiment of the present invention.

As shown in FIG. 13, a metal film 36 is formed by plating, CVD, or PVD. The metal film 36 is polished by CMP until the surface of the first insulating film 40 is exposed. As shown in FIG. 14, the first via plug 35e on a barrier metal 34e, the first diagonal wire 42e, the first via plug 35f on a barrier metal 34f, the first diagonal wire 42f, and the first wire 41l on a barrier metal 34l are formed. Accordingly, as shown in the plan view of FIG. 15, a plurality of the first wires 41a, 41b, 41c, . . . , 41l, . . . , are formed on the first grid area 401. The first diagonal wires 42a, 42b, . . . , 41h, . . . connected to the first wires 41a, 41b, 41c, . . . , 41l, . . . , are formed in the first diagonal grid area 402.

Figure 16:
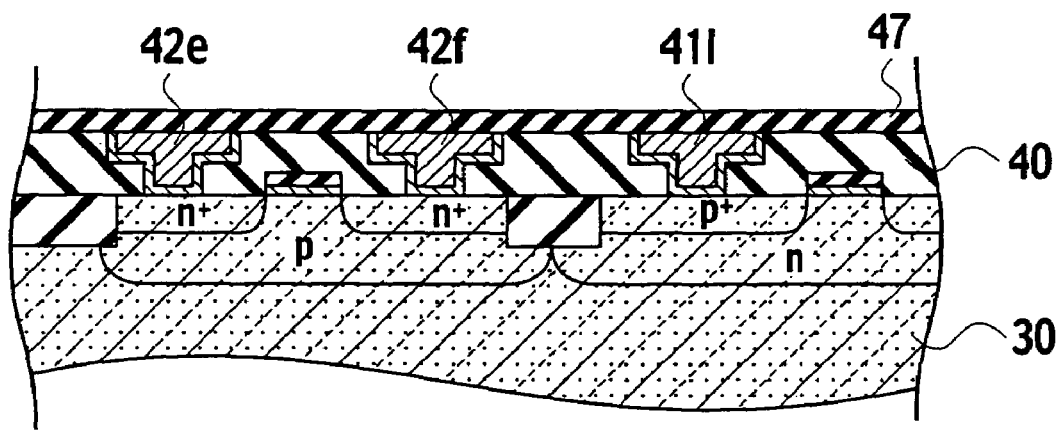
FIG. 16 is a cross-sectional view illustrating the method of manufacturing the semiconductor integrated circuit.
Figure 17:
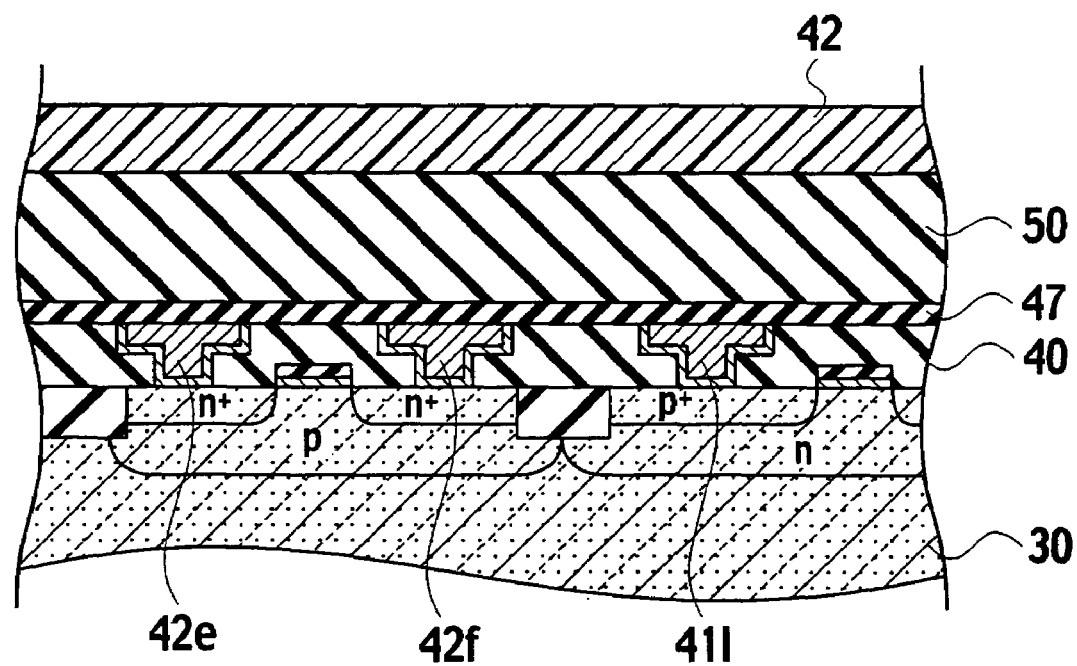
FIG. 17 is a cross-sectional view illustrating the method of manufacturing the semiconductor integrated circuit.

As shown in FIG. 16, the first stopper film 47 is deposited on the surfaces of the first wire 41l, the first diagonal wires 42e and 42f, and the first insulating film 40 by CVD. For the material of the first stopper film 47, silicon carbide (SiC), carbon-doped silicon nitride (SiCN), SiN, carbon-doped silicon oxide (SiOC) is agreeable. Subsequently, as shown in FIG. 17, the second insulating film 50 is formed on the first stopper film 47 by CVD. For the material of the second insulating film 50, a porous low-dielectric constant film such as organic silicon oxide film, inorganic silicon oxide film, CF film may be suitable. A photoresist film 42 is applied on the second insulating film 50.

Figure 18:
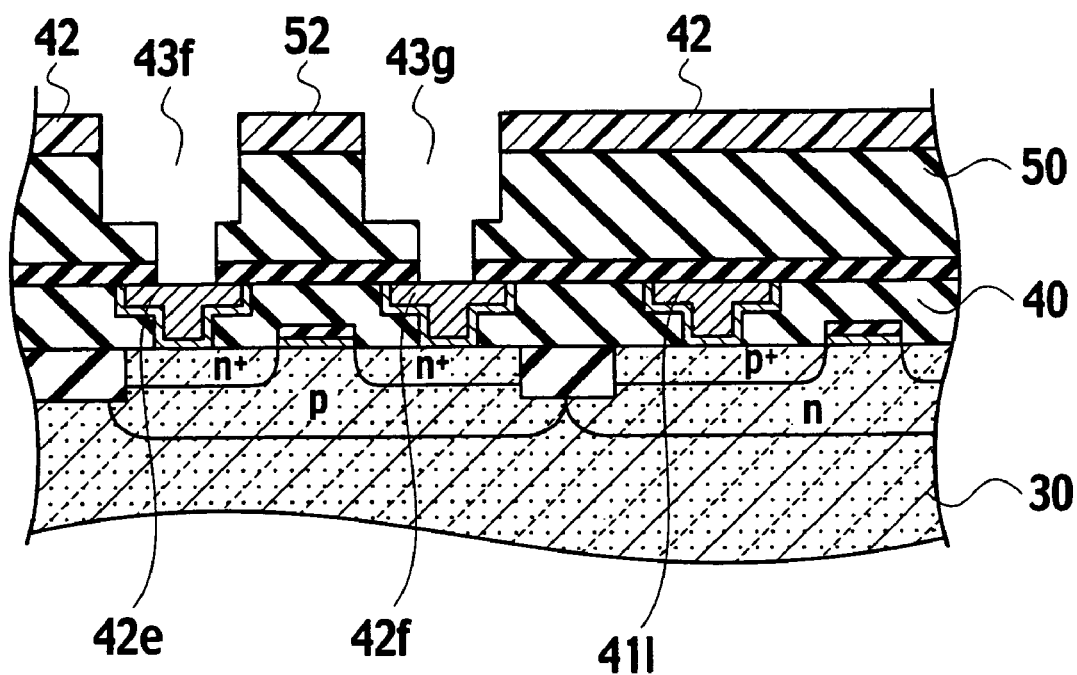
FIG. 18 is a cross-sectional view illustrating the method of manufacturing the semiconductor integrated circuit.
Figure 19:
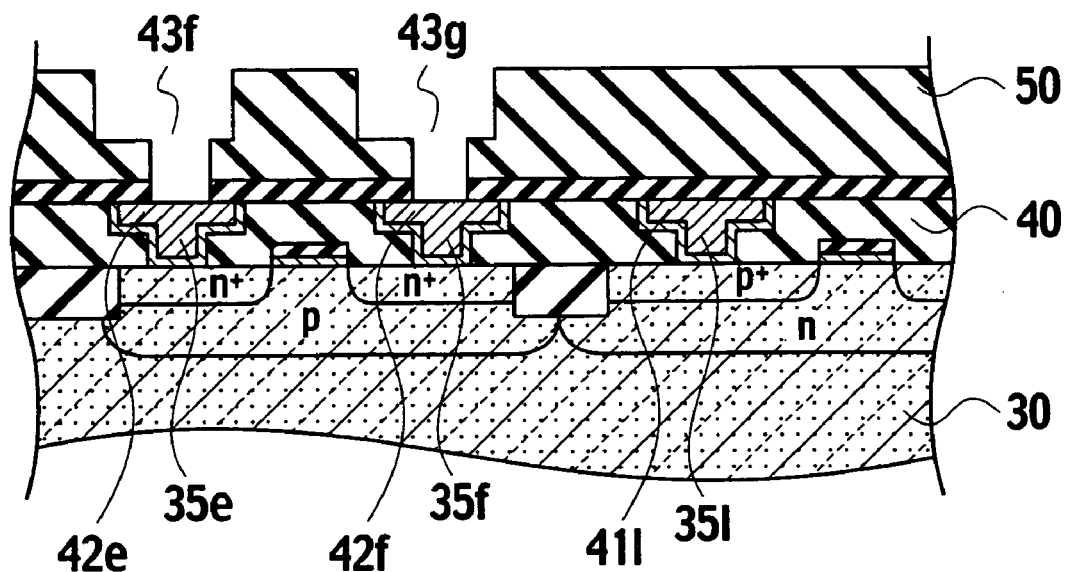
FIG. 19 is a cross-sectional view illustrating the method of manufacturing the semiconductor integrated circuit.
Figure 20:
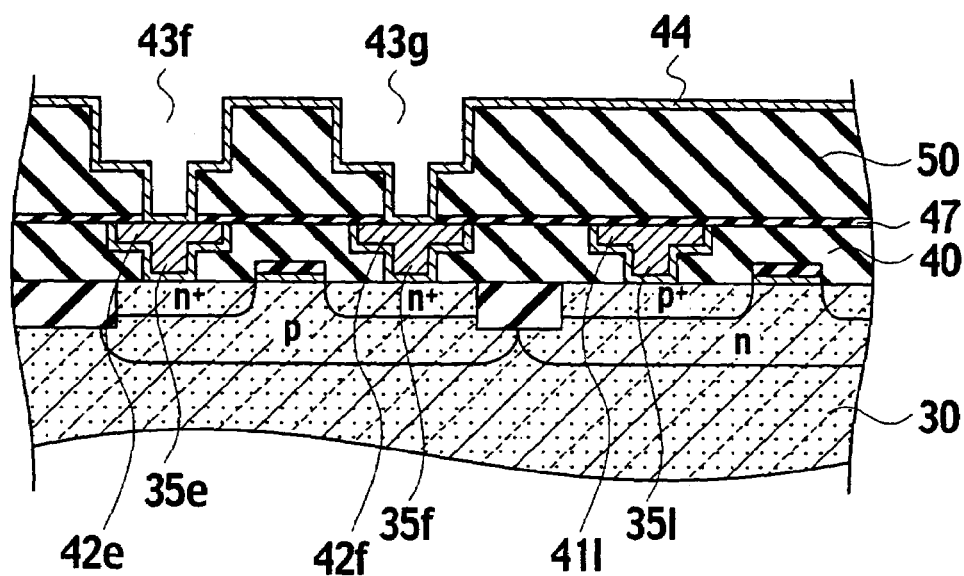
FIG. 20 is a cross-sectional view illustrating the method of manufacturing the semiconductor integrated circuit.

As shown in FIG. 18, a photoresist film 42 is delineated by use of a photolithography process. Part of the second insulating film 50 is selectively stripped by RIE using the delineated photoresist film 42 as an etching mask to form trenches 43f, and 43g and via holes. As shown in FIG. 19, the photoresist film 42 is removed. As shown in FIG. 20, a barrier metal 44 is deposited on the surface of the second insulating film 50, the trenches 43f and 43g and via holes. A metal film is formed on the barrier metal 44. The metal film is polished by CMP until the surface of the second insulating film 50 is exposed.

Figure 21:
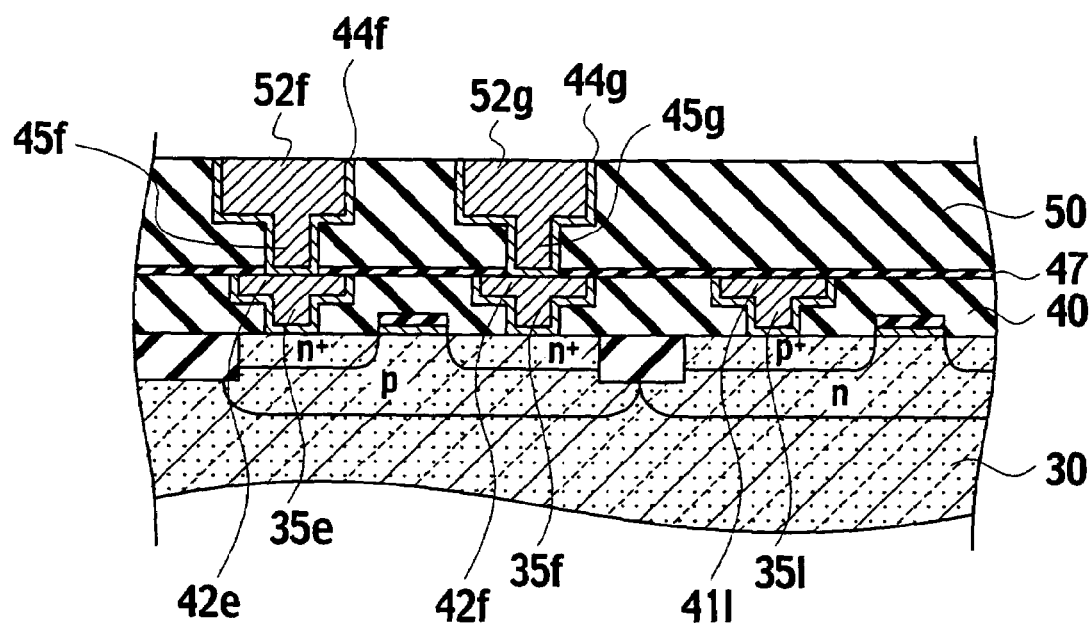
FIG. 21 is a cross-sectional view taken online XXI-XXI in FIG. 22.
Figure 22:
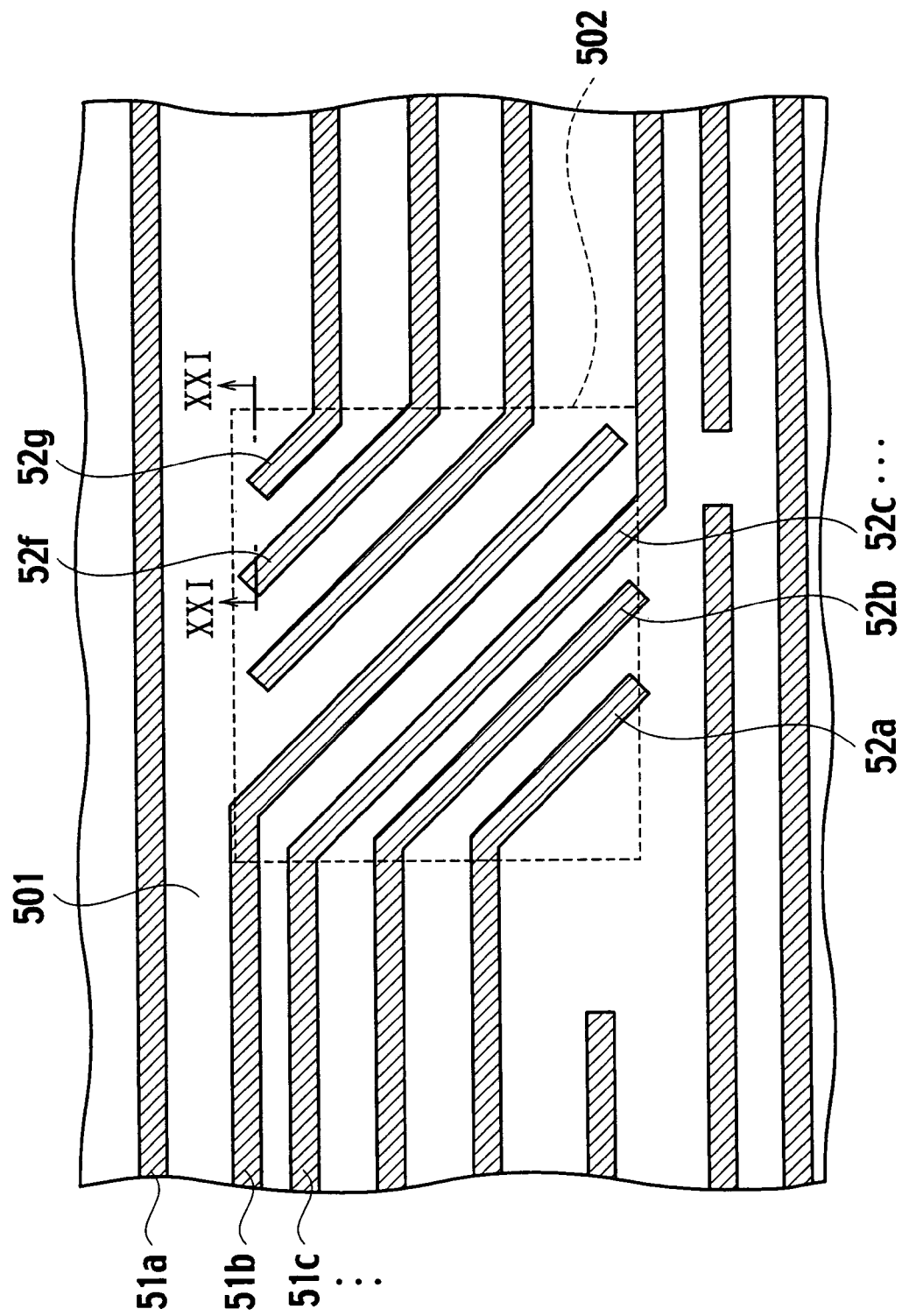
FIG. 22 is a plan view illustrating the method of manufacturing the semiconductor integrated circuit according to the embodiment of the present invention.

As shown in FIG. 21, the second via plug 45f on a barrier metal 44f, the second diagonal wire 52f, the second via plug 45g on a barrier metal 44g and the second diagonal wire 52g are formed. Accordingly, as shown in the plan view of FIG. 22, a plurality of the second wires 51a, 51b, 51c, . . . , are formed in the second wire area 501. The second diagonal wires 52a, 52b, . . . , 52g, . . . , connected to the second wires 51a, 51b, 51c, . . . , are formed in the second diagonal grid area 502.

Figure 23:
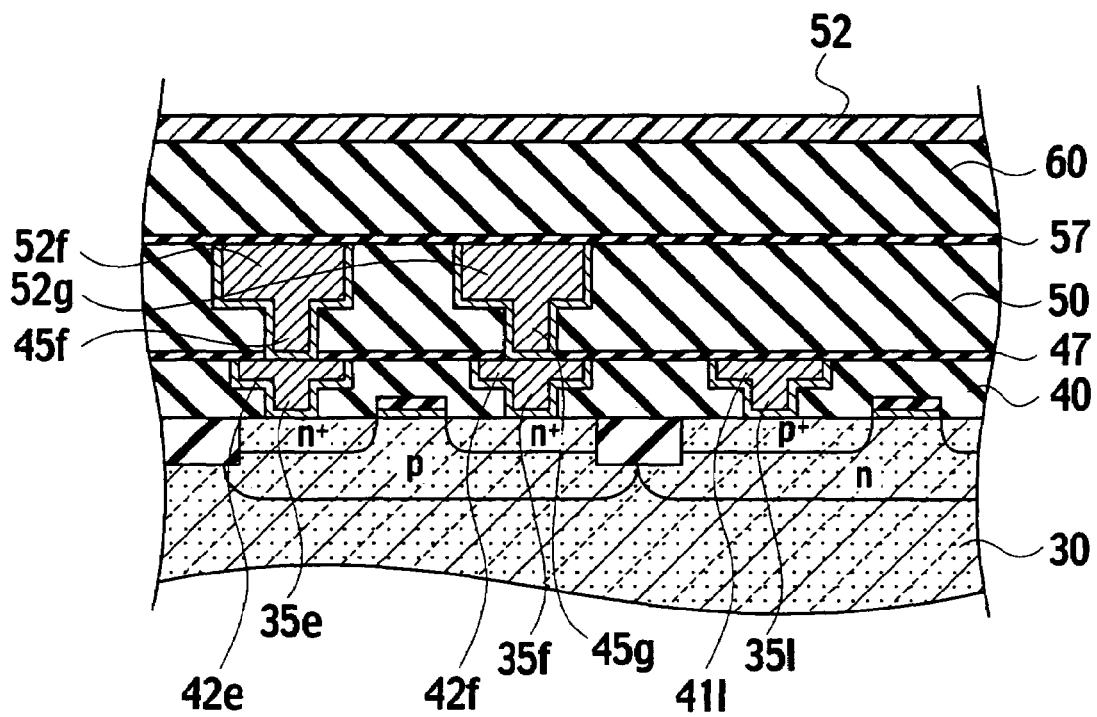
FIG. 23 is a cross-sectional view illustrating the method of manufacturing the semiconductor integrated circuit.
Figure 24:
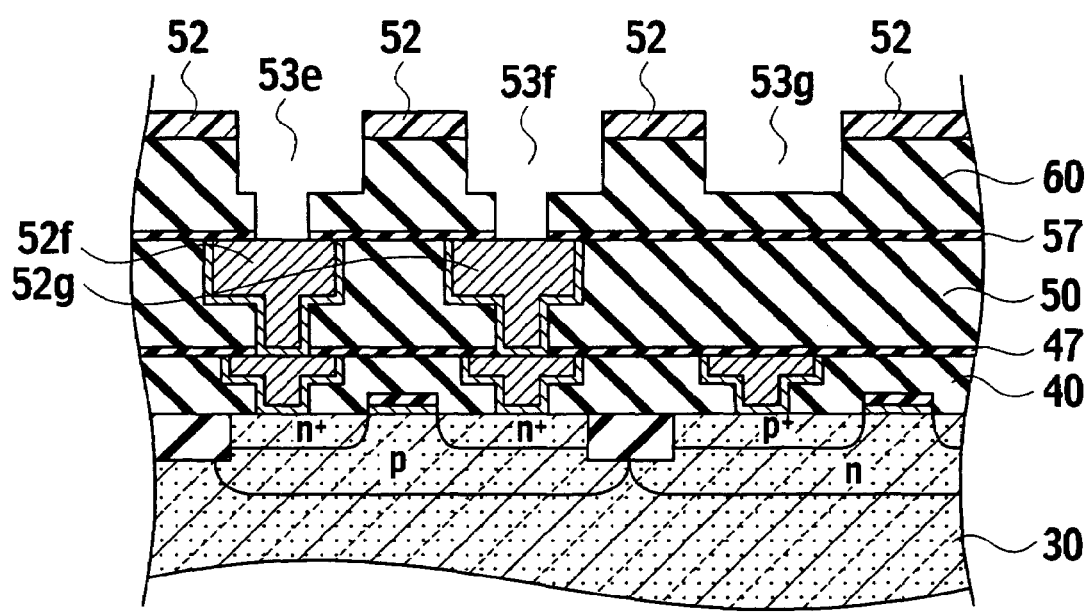
FIG. 24 is a cross-sectional view illustrating the method of manufacturing the semiconductor integrated circuit.
Figure 25:
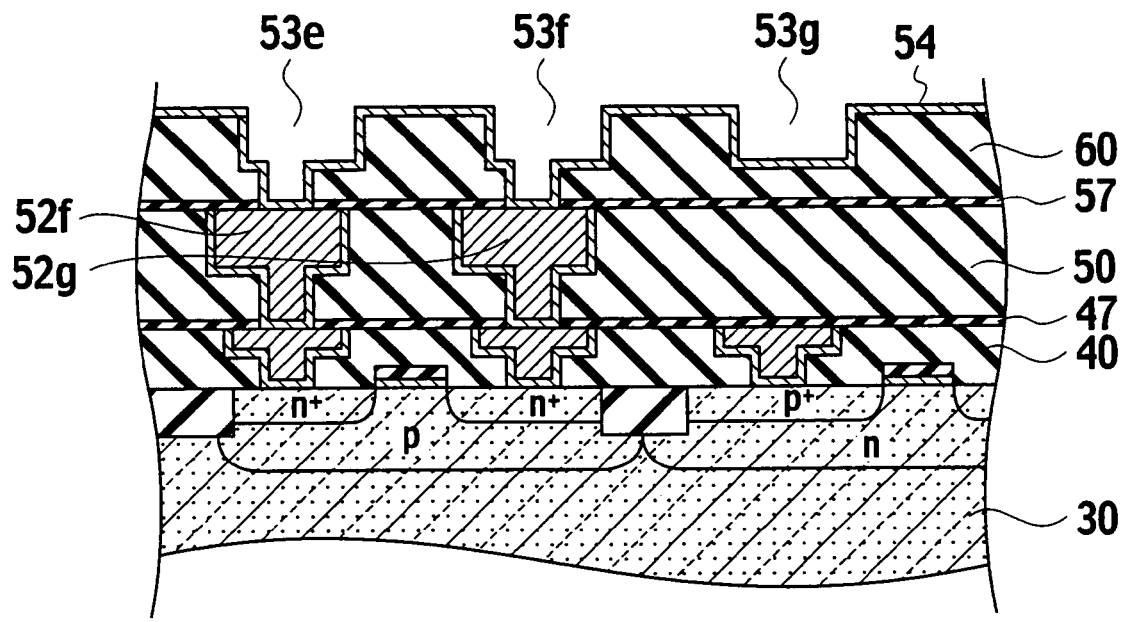
FIG. 25 is a cross-sectional view illustrating the method of manufacturing the semiconductor integrated circuit.

As shown in FIG. 23, the second stopper film 57 is formed on the surfaces of the second diagonal wires 52f and 52g and the second insulating film 50. The third insulating film 60 is formed on the second stopper film 57 by CVD. A photoresist film 52 is applied on the third insulating film 60. The photoresist film 52 is delineated by use of a photolithography process. As shown in FIG. 25, part of the third insulating film 60 is selectively stripped by RIE using the delineated photoresist film 52 as an etching mask to form trenches 53e, 53f and 53g and via holes. The residual photoresist film 52 is removed.

Figure 26:
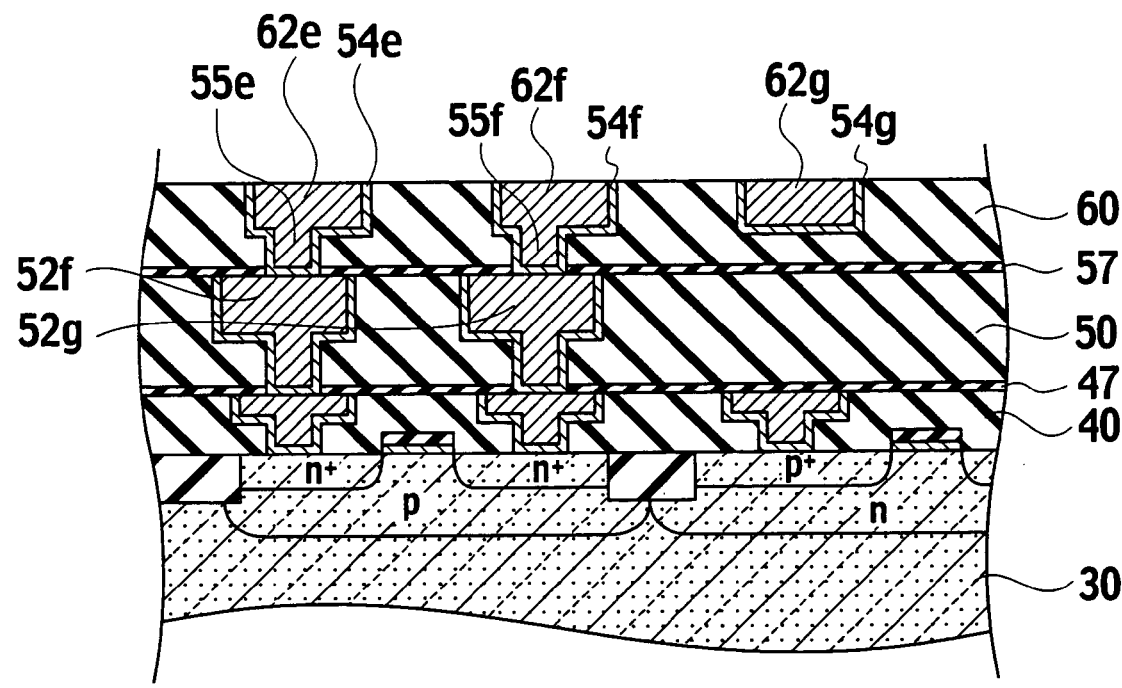
FIG. 26 is a cross-sectional view taken on line XXVI-XXVI in FIG. 27.
Figure 27:
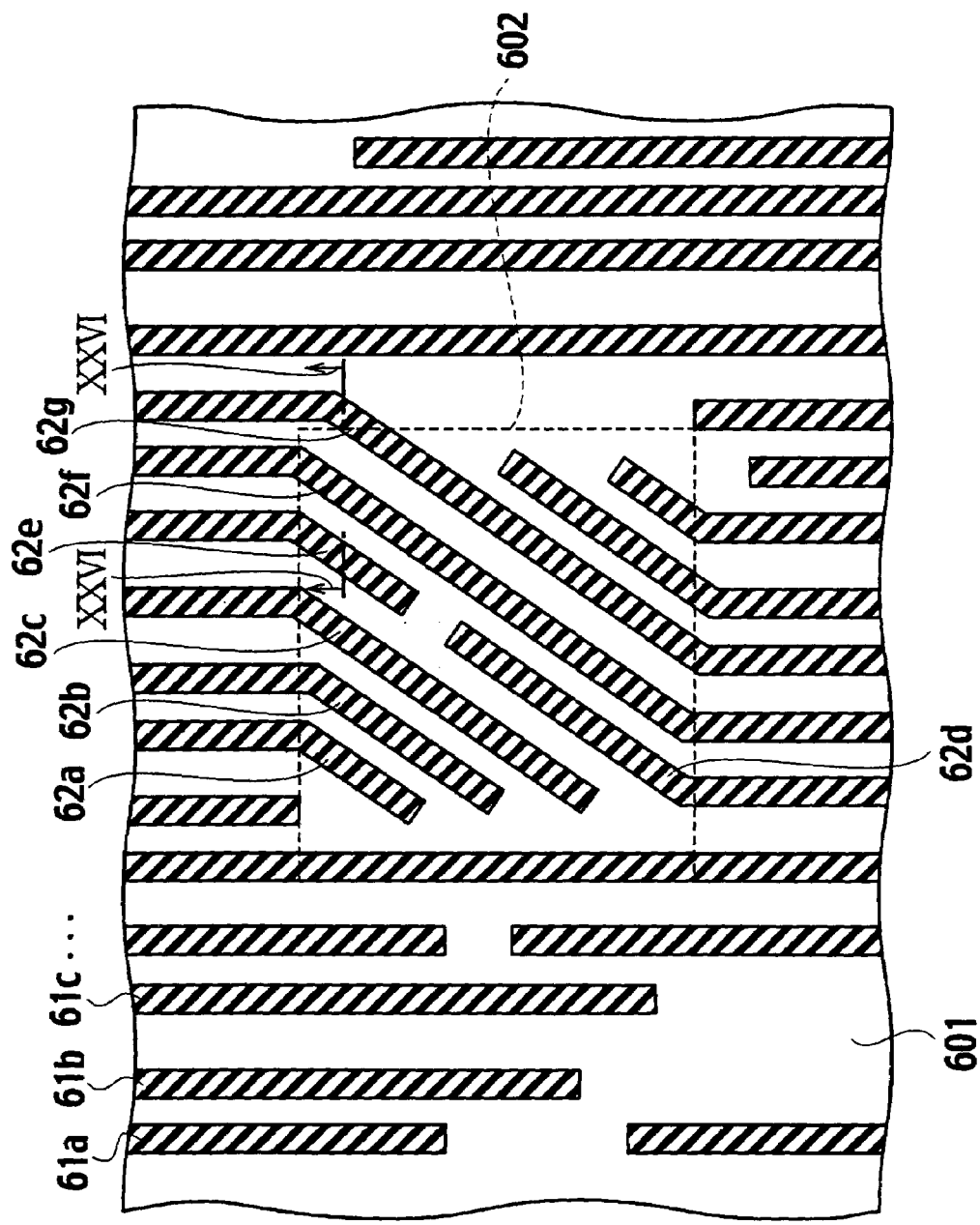
FIG. 27 is a plan view illustrating the method of manufacturing the semiconductor integrated circuit according to the embodiment of the present invention.

As shown in FIG. 25, a barrier metal 54 is deposited on the surface of the third insulating film 60, the trenches 53e, 53f, and 53g, and via holes. A metal film is formed on the barrier metal 54 and polished by CMP. As shown in FIG. 26, the third via plug 55e and the third diagonal wire 62e are formed in the third insulating film 60 through a barrier metal 54e. The third via plug 55f and the third diagonal wire 62f are formed in the third insulating film 60 through a barrier metal 54f. The third wire 62g is formed in the third insulating film 60 through a barrier metal 54g. Accordingly, as shown in the plan view of FIG. 27, a plurality of the third wires 61a, 61b, 61c, . . . , are formed in the third wire area 601. The third diagonal wires 62a, 62b, 62g, . . . , connected to the third wires 61a, 61b, 61c, . . . , are formed in the third diagonal grid area 602.

Figure 28:
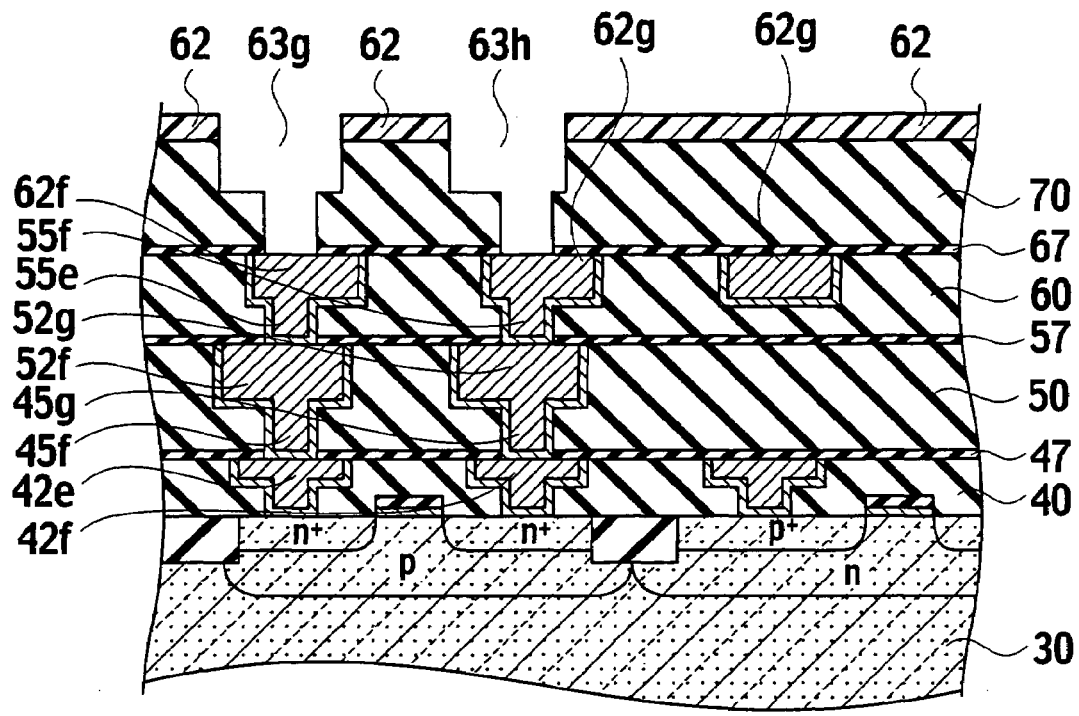
FIG. 28 is a cross-sectional view illustrating the method of manufacturing the semiconductor integrated circuit.

As shown in FIG. 28, the third stopper film 67 is formed on the surfaces of the third diagonal wires 62e and 62f, third wire 62g, and the third insulating film 60 by CVD. A fourth insulating film 70 is formed on the third stopper film 67 by CVD. A photoresist film 62 is applied on the fourth insulating film 70 and delineated by use of the photolithography process. The trenches 63g and 63h and via holes are formed by using the delineated photoresist film 62 as an etching mask. The photoresist film 62 is removed by RIE.

Figure 29:
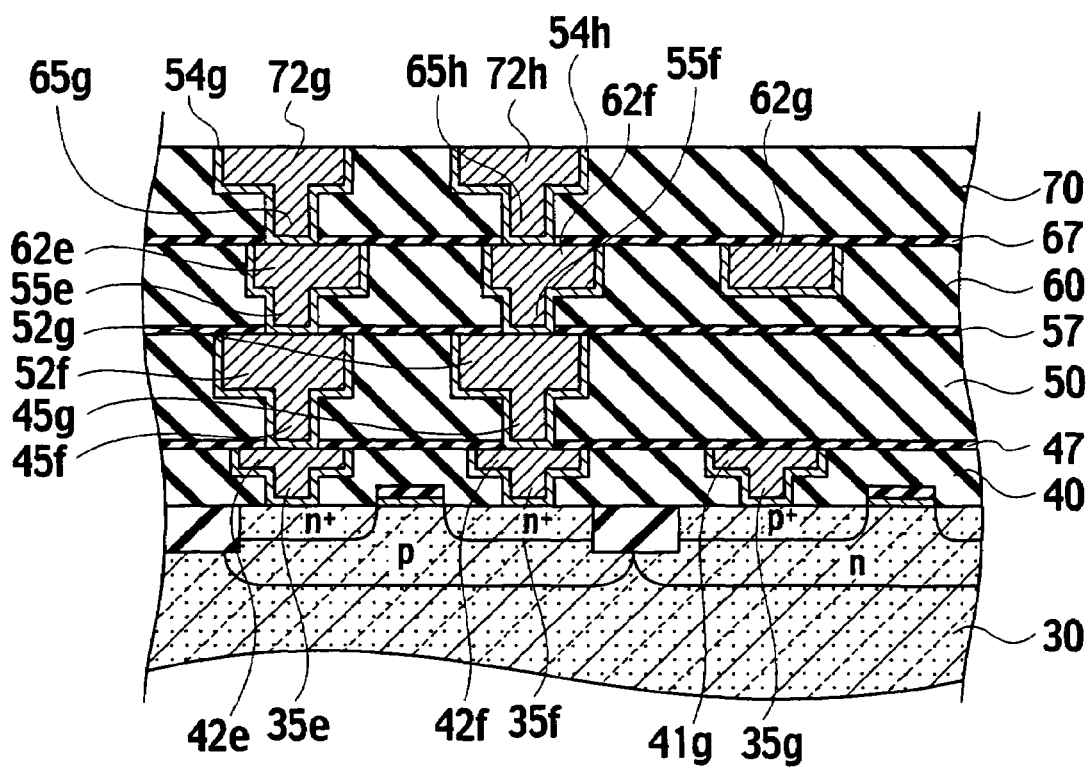
FIG. 29 is a cross-sectional view taken on line XXIX-XXIX in FIG. 30.
Figure 30:
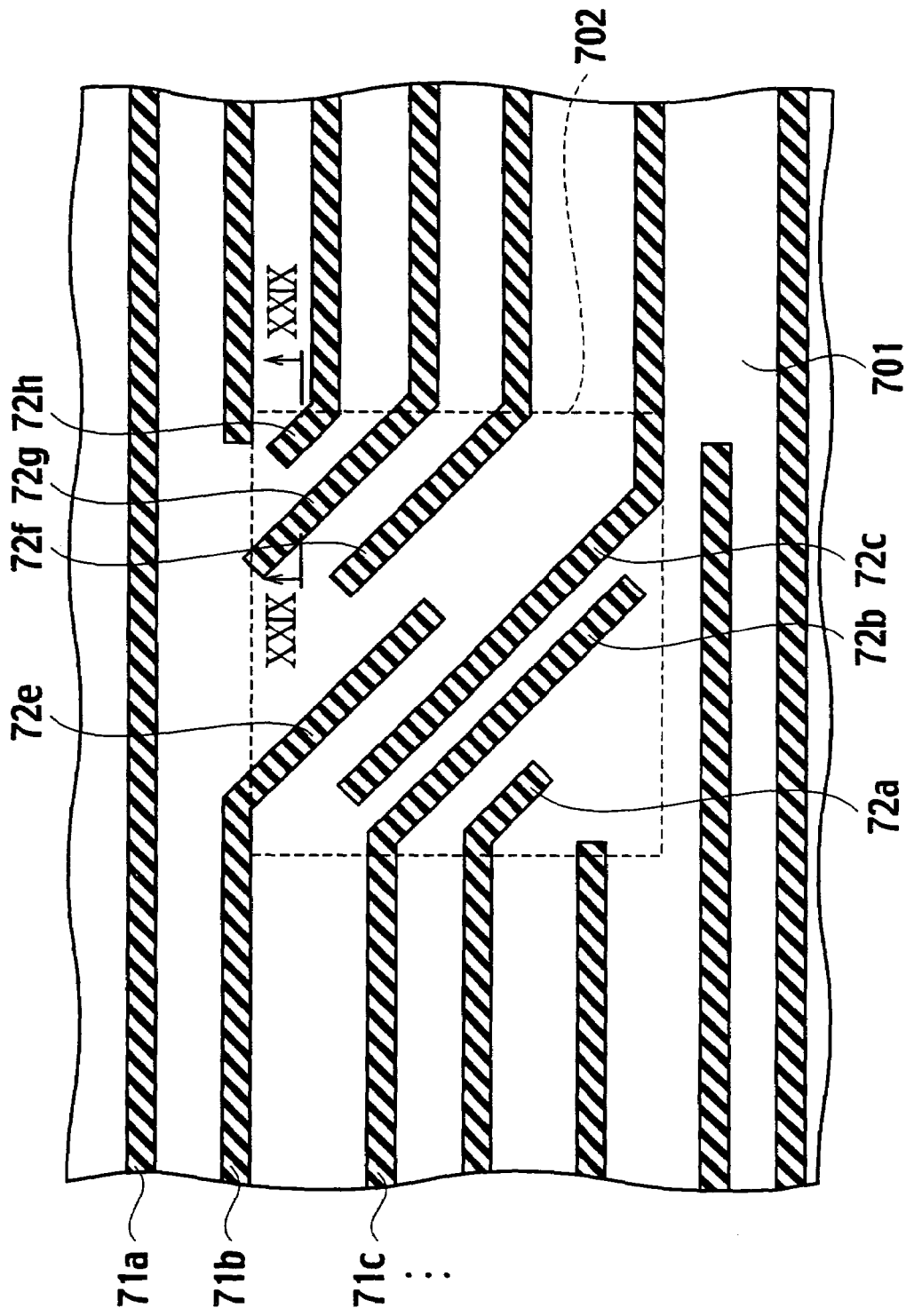
FIG. 30 is a plan view illustrating the method of manufacturing the semiconductor integrated circuit according to the embodiment of the present invention.

As shown in FIG. 29, a barrier metal is deposited on surfaces of the trenches 63g and 63h, and via holes by plazma CVD, a metal film is formed on the barrier metal and polished by CMP. The fourth via plug 54g and the fourth diagonal wire 72g are buried in the trench 63g through the barrier metal 54g. The fourth via plug 65h and the fourth diagonal wire 72h are buried in the trench 63h through the barrier metal 54h. Accordingly, as shown in the plan view of FIG. 30, a plurality of the fourth wires 71a, 71b, 71c, . . . , are formed in the fourth wire area 701. The fourth diagonal wires 72a, 72b, . . . 72h, . . . , connected to the fourth wires 71a, 71b, 71c, . . . , are formed in the fourth diagonal grid area 702. The fourth stopper film 77 is formed on the fourth insulating film 70 by CVD. The semiconductor integrated circuit as shown in FIG. 9 is then manufactured.

With the method of manufacturing a semiconductor integrated circuit according to the embodiment, the diagonal wires (the first to fourth diagonal wires 42a, 42b, . . . , 72a, 72b, . . . ) can be formed in areas where crosstalk may occur. The wire pitch can be therefore increased without violating the design rule, and crosstalk can be reduced. Furthermore, the areas where the diagonal wires are placed are disposed in each of the wiring layers constituting a multi-level interconnect structure on the substrate 30 so as to correspond to each other, thus reducing the misalignment of vias connecting wires.

OTHER EMBODIMENTS

Various modifications will become possible for those skilled in the art after receiving the teachings of the present disclosure without departing from the scope thereof.

The first diagonal grid areas 402a, 402b, . . . set by the first diagonal grid area setting module 143 can be properly changed based on the circuit information of the chip area. For example, when RAM, ROM, DSP, and the like, each of which requires an area of certain size, are used to form an integrated circuit, the entire area where RAM, ROM, DSP, and the like are placed is set to the diagonal grid area. In a semiconductor integrated circuit including an ASIC and a PLD mixed, the first grid area to place the orthogonal wires and the first diagonal grid area to place the diagonal wires can be placed in the ASIC part and the PLD part, respectively.

In the interconnect of the first layer designed by the first routing module 14, either power supply wires, clock wires, or signal wires can be placed.

The semiconductor integrated circuit shown in FIG. 9 exemplifies a semiconductor integrated circuit including four metal wiring layers but may include any number of metal wiring layers.

Figure 31:
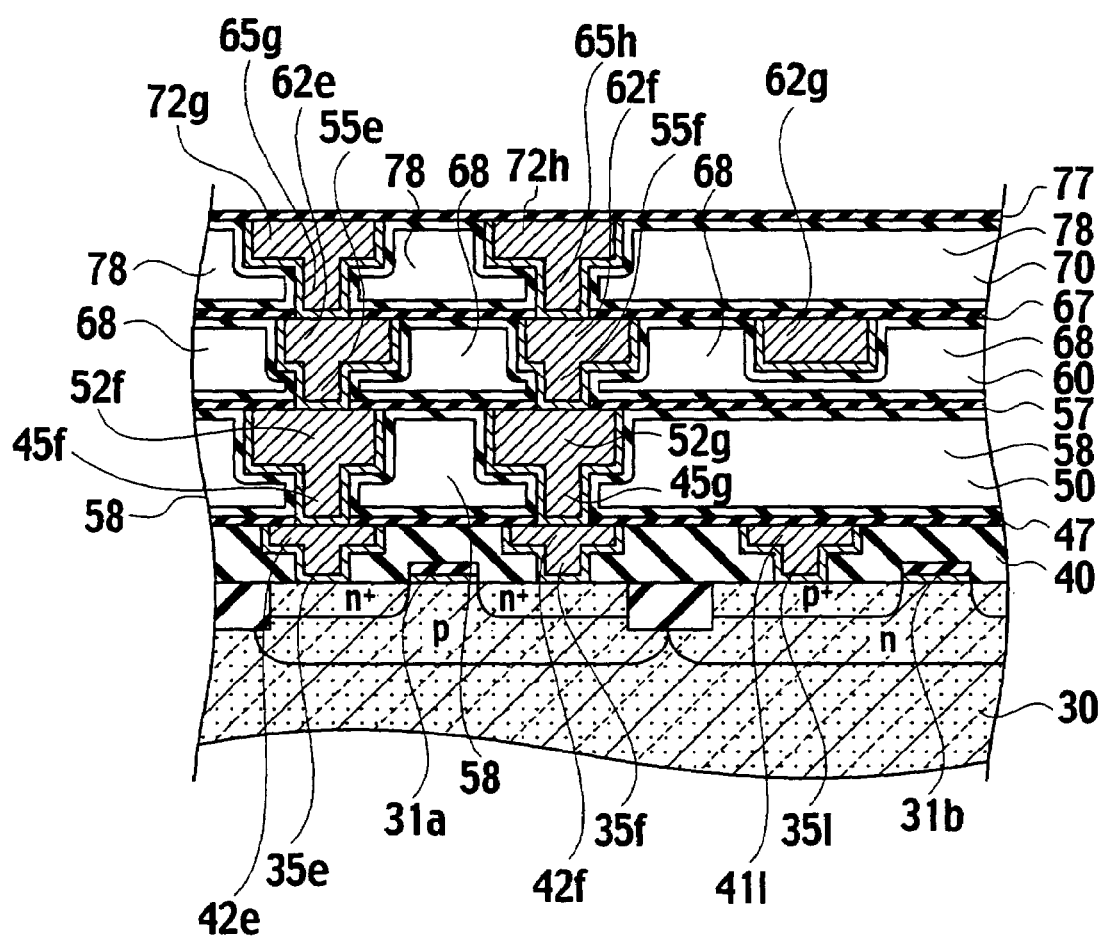
FIG. 31 is a cross-sectional view illustrating a semiconductor integrated circuit according to the other embodiments of the present invention.

In addition to the semiconductor integrated circuits shown in FIGS. 8 and 9, various semiconductor integrated circuits can be manufactured. For example, as shown in FIG. 31, a second stopper film 57 on a second insulating film 50, a third stopper film 67 on a third insulating film 60, a fourth stopper film 77 of a fourth insulating film 70, which are sequentially formed in a thickness direction of the substrate 30, are individually perforated, and then cavities 58, 68, and 78 are formed in the second, third, and fourth insulating films 50, 60, and 70 by $O_2$ asher, respectively. The second to fourth diagonal wires 52f, 52g, 62e, 62f, 62g, 72g, and 72h thus form air gap interconnect. The relative dielectric constant between the insulating layers is reduced, and the signal transmission delay can be further reduced.

Figure 32:
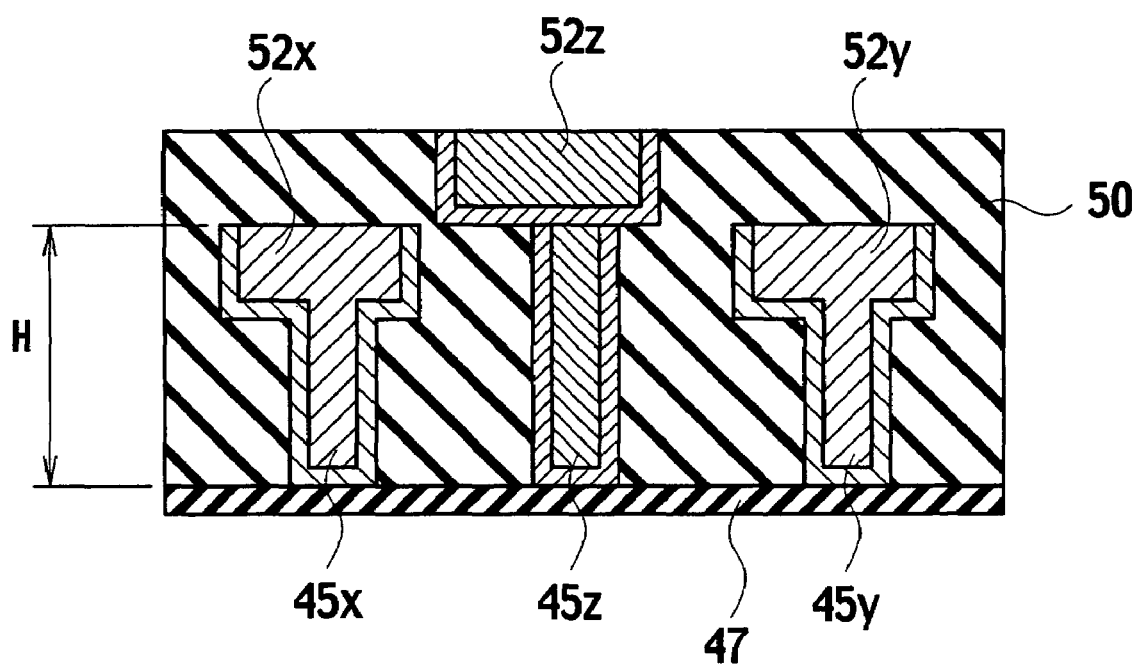
FIG. 32 is a cross-sectional view illustrating a semiconductor integrated circuit according to the other embodiments of the present invention.

As shown in FIG. 32, in the second insulating film 50, a second via plug 45z with a height H and second via plugs 45x and 45y with heights less than the height H of the second via plug 45z are embedded. The second via plugs 45x and 45y are adjacent to the second via plug 45z. The second via plug 45z is connected to a second diagonal wire 52z; the second via plug 45x is connected to a second diagonal wire 52x; and the second via plug 45y is connected to a second diagonal wire 52y.

The thus obtained second diagonal wires 52x, 52y, and 52z are different from each other in height. The distance between the wires therefore is increased, and the parasitic capacitance between the wires is reduced. Also in the semiconductor integrated circuit with the structure shown in FIG. 32, it is possible to reduce the signal transmission delay influenced by the parasitic capacitance between wires and occurrence of crosstalk, which becomes prominent as the distance between wires gets smaller. The second diagonal wires 52x, 52y, and 52z shown in FIG. 32 can be formed by only changing the height of the second via plugs 45x, 45y, and 45z based on a two-dimensional layout obtained by the design system shown in FIG. 1, and patterns of the wiring layers can be easily designed.

Considering the influence of the parasitic capacitance between wires and occurrence of crosstalk, it is suitable in the semiconductor integrated circuit shown in FIG. 32 that the height H of the lower surface of the second diagonal wire 52z is set substantially equal to or more than the height of the upper surfaces of the second diagonal wires 52x and 52y connected to the second via plugs 45x and 45y. In the second diagonal wires 52x, 52y, and 52z, side faces of two adjacent wire structures therefore do not face each other, and the parasitic capacitance between wires can be reduced. It is obvious that, to be exact, the height H of the lower surface of the second diagonal wire 52z vertically changes to some extent due to etching in the manufacturing process and the like.

Figure 33:
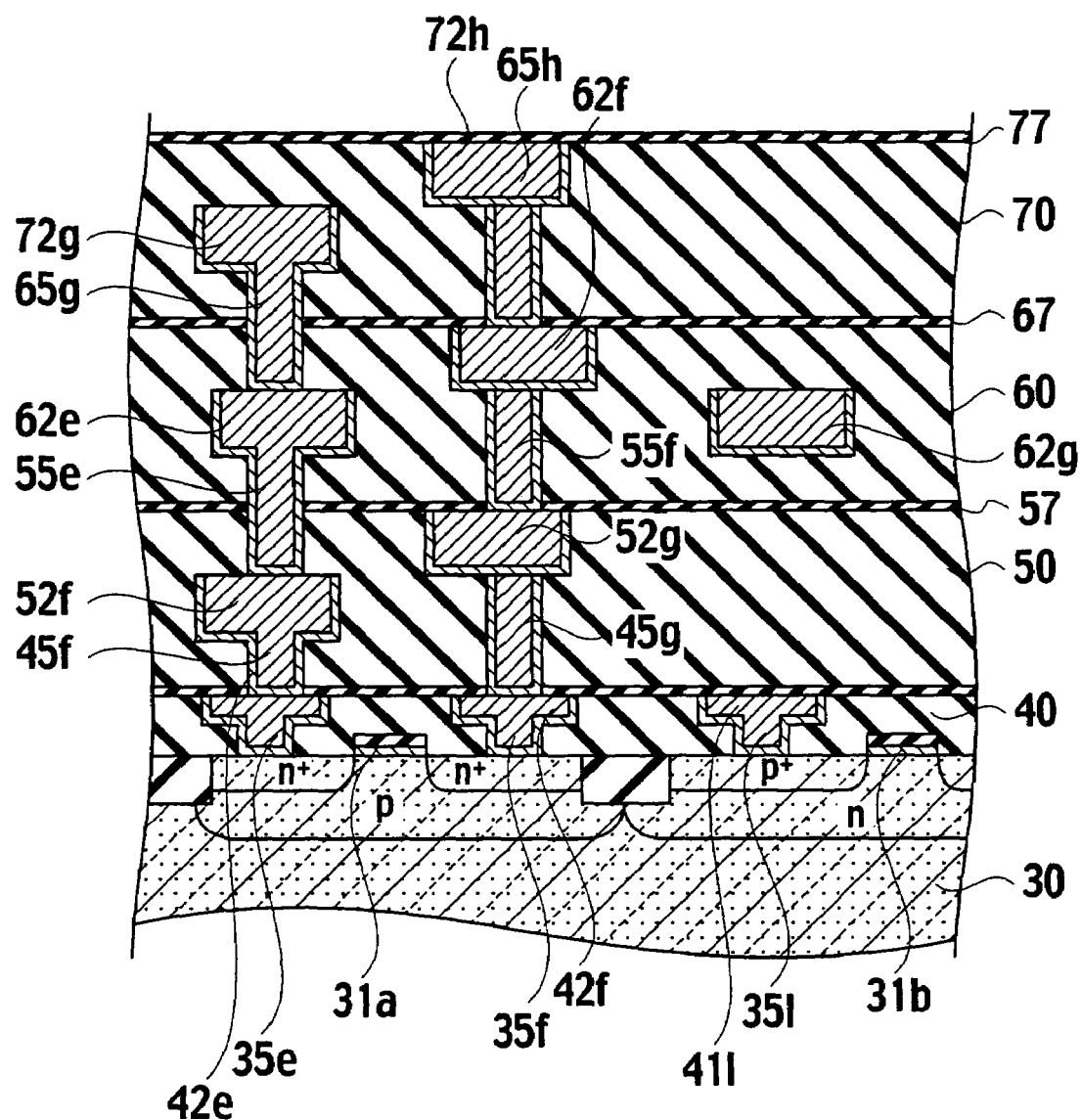
FIG. 33 is a cross-sectional view illustrating a multi-level interconnect in the semiconductor integrated circuit according to the other embodiments of the present invention.
Figure 34:
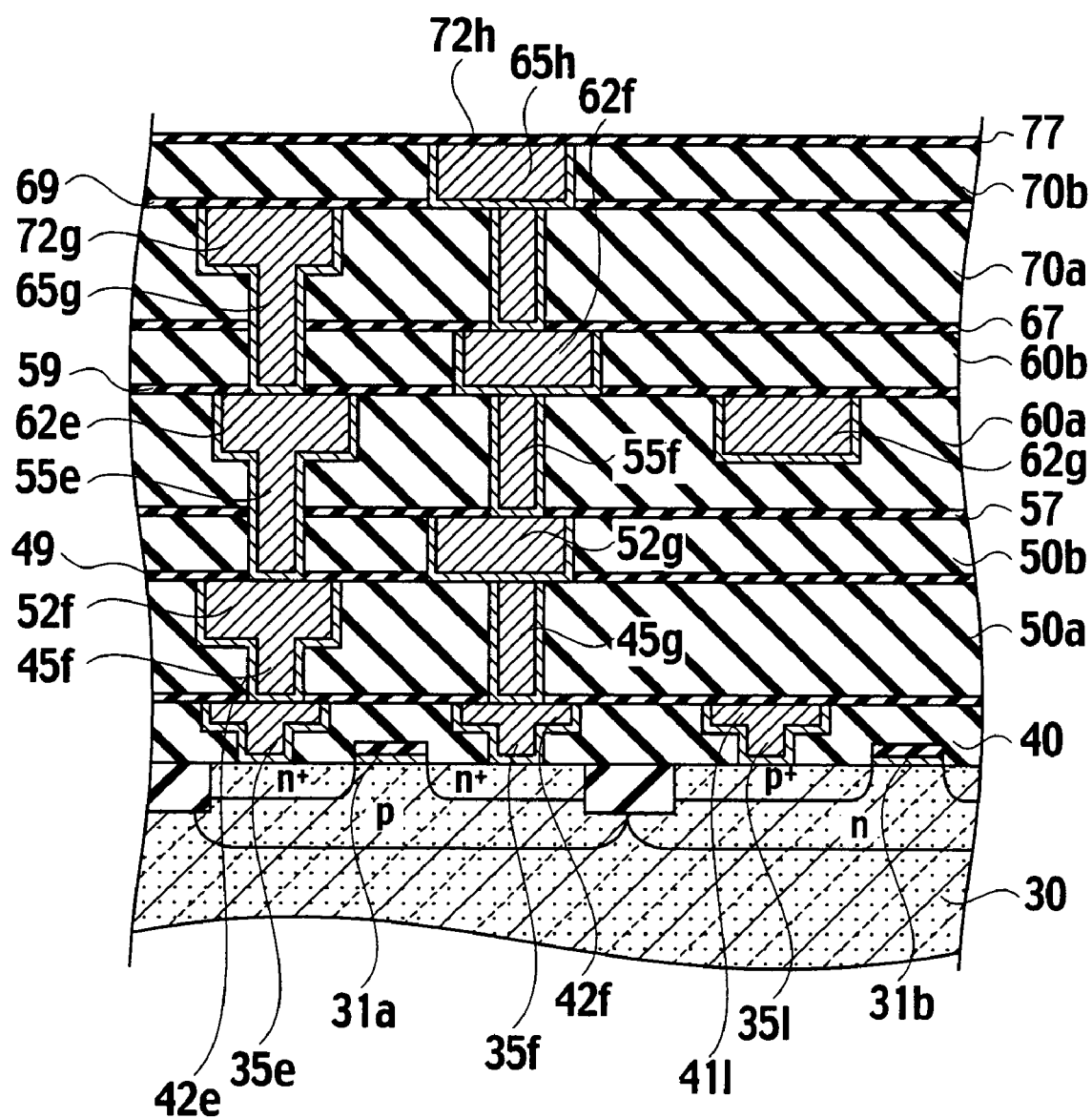
FIG. 34 is a cross-sectional view illustrating a multi-level interconnect in the semiconductor integrated circuit according to the other embodiments of the present invention.

FIG. 33 shows an example in which the interconnect structure shown in FIG. 32 is applied to the second to fourth layers of the integrated circuit shown in FIG. 9. FIG. 34 shows an example in which a diffusion preventing film (stopper film) is disposed on each of upper surfaces of the second diagonal wire 52f, third diagonal wire 62e, third wire 62g, and fourth diagonal wire 72g. In this case, film materials of the second insulating film 50a and 50b may be either the same or different; film materials of the third insulating films 60a and 60b may be either the same or different; and film materials of the fourth insulating films 70a and 70b may be either the same or different. The semiconductor integrated circuits shown in FIGS. 31 to 34 shown as the examples include four metal wiring layers but may include any number of metal wiring layers depending on the application. For example, the interconnect structures as shown in FIGS. 31-34 may be suitable for the semiconductor integrated circuit including multi-level interconnect of 4-20 layers or 9-12 layers.

Figure 35:
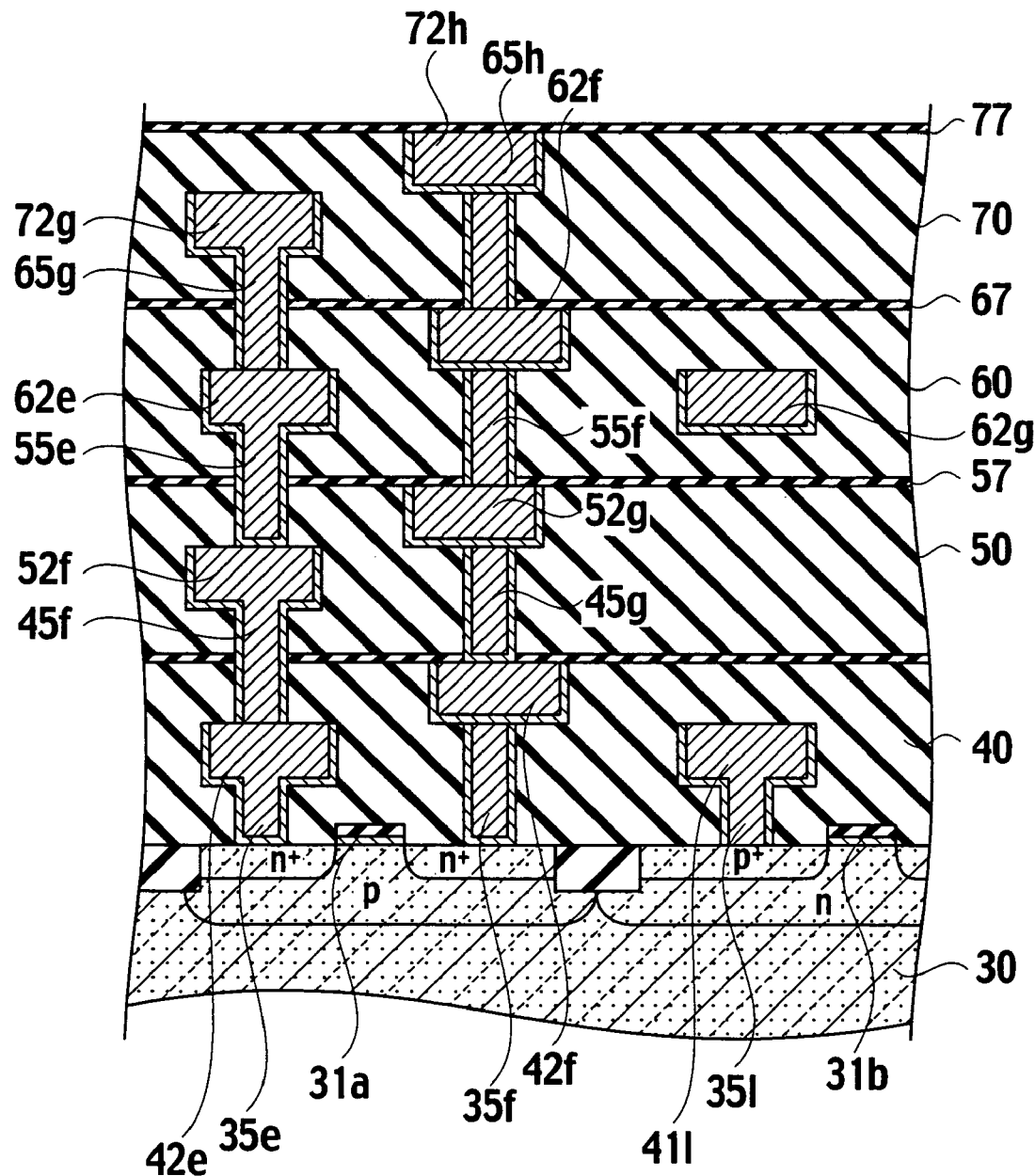
FIG. 35 is a cross-sectional view illustrating a multi-level interconnect in the semiconductor integrated circuit according to the other embodiments of the present invention.
Figure 36:
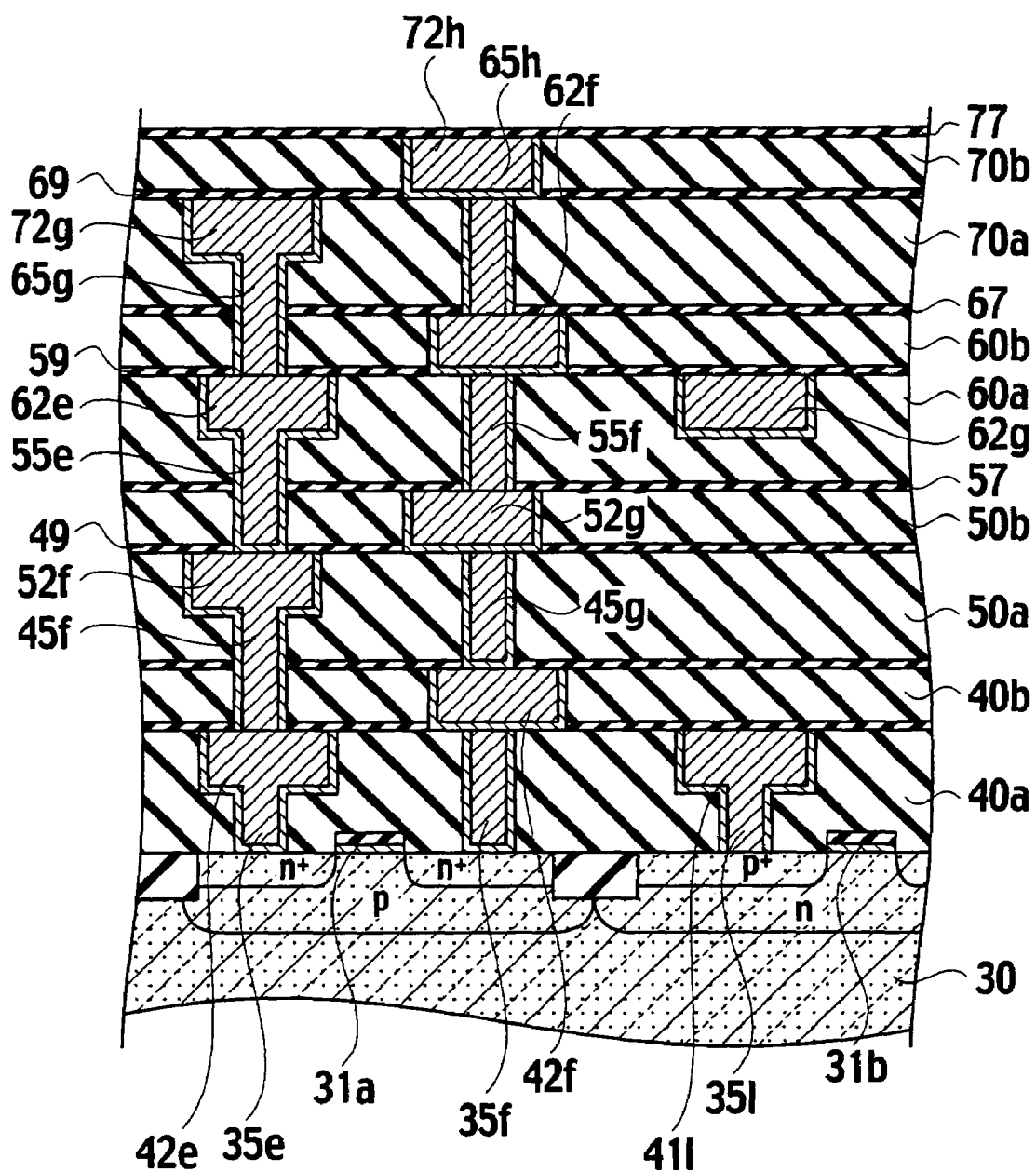
FIG. 36 is a cross-sectional view illustrating a multi-level interconnect in the semiconductor integrated circuit according to the other embodiments of the present invention.

FIG. 35 shows an example in which the interconnect structure shown in FIG. 32 is applied to the first to fourth layer of the integrated circuit shown in FIG. 9. FIG. 36 shows an example in which a diffusion preventing film (stopper film) is disposed on each of the upper surfaces of the second diagonal wire 52f, third diagonal wire 62e, third wire 62g, and fourth diagonal wire 72g. In this case, film materials of the second insulating films 50a and 50b may be either the same or different; film materials of the third insulating films 60a and 60b may be either the same or different; and film materials of the fourth insulating films 70a and 70b may be either the same or different.

Also in the semiconductor integrated circuits shown in FIGS. 33 to 36, side faces of two adjacent wire structures do not face each other. The distance between wires is increased, and the parasitic capacitance between wires is reduced. In the semiconductor integrated circuits shown in FIGS. 33 to 36, it is therefore possible to reduce the signal transmission delay due to the parasitic capacitance between wires and occurrence of crosstalk, which become prominent as the distance between wires gets smaller.

Figure 37:
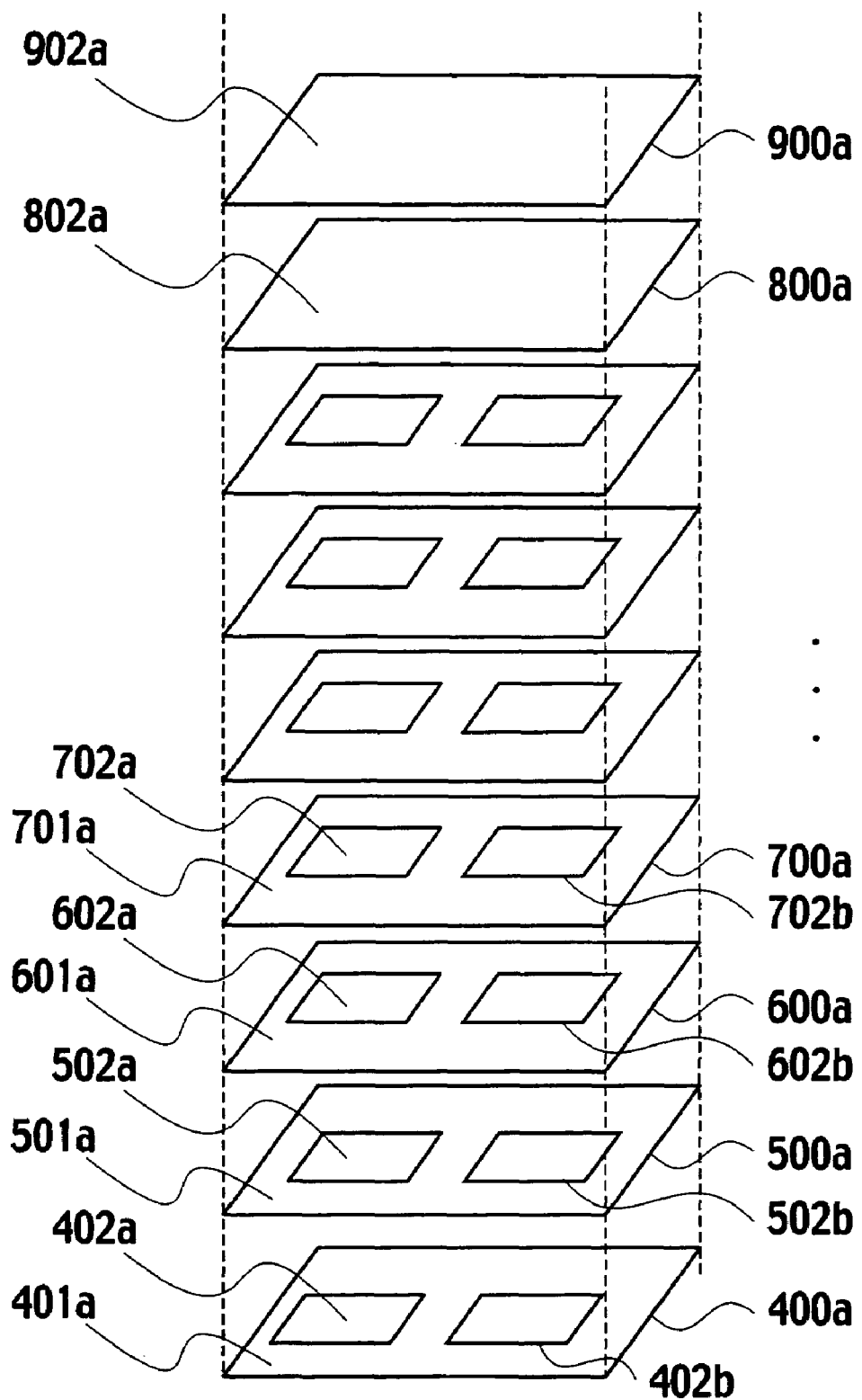
FIG. 37 is a schematic diagram illustrating grid areas of the multi-level interconnect in the semiconductor integrated circuit according to the other embodiments of the present invention.

As shown in FIG. 37, in the semiconductor integrated circuit according to the embodiment, the topmost wiring layers (k-th wiring layer 800a, (k+1)-th wiring layer 900a) can be set to the diagonal grid area. In this case, the diagonal grid area is set directly over areas where crosstalk may occur, and the occurrence of crosstalk can be suppressed. It is therefore possible to provide a semiconductor integrated circuit using a design method with the placement of via holes less restricted.

As shown in the perspective view of FIG. 38 and the plan view of FIG. 39, the area of the first to (k+1)-th diagonal grid areas 402a, 502a, 602a, 702a, . . . , can be set to broaden while advancing toward the upper layer. As shown in the perspective view of FIG. 40 and the plane view of FIG. 41, a plurality of first to third diagonal grid areas 402a, 502a, 602a, 402b, 502b, and 602b can be selectively set to the first to third wiring layers 400a, 500a, and 600a, respectively.

Figure 43:
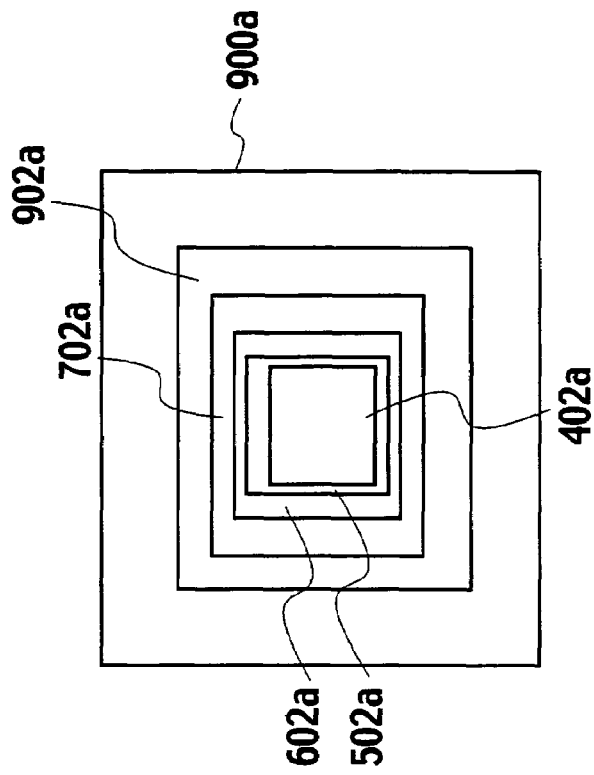
FIG. 43 is a plan view illustrating grid areas of the multi-level interconnect in the semiconductor integrated circuit according to the other embodiments of the present invention.
Figure 42:
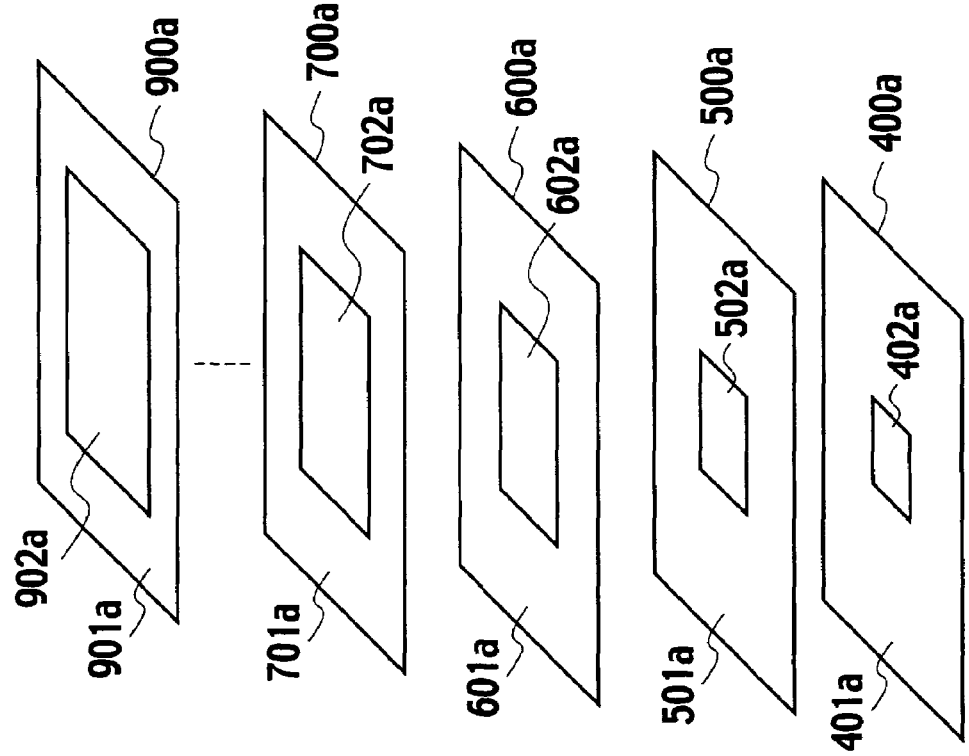
FIG. 42 is a schematic view illustrating grid areas of the multi-level interconnect in the semiconductor integrated circuit according to the other embodiments of the present invention.

As shown in the perspective view of FIG. 42 and the plan view of FIG. 43, the first to (k+1)-th diagonal grid areas 402a, 502a, 602a, 702a, . . . , and 902a having different areas can be set to the first to (k+1)-th wiring layers 400a, 500a, . . . , and 900a. As shown in the perspective view of FIG. 44 and the plan view of FIG. 45, a plurality of the first to (k+1)-th diagonal grid areas 402a, 502a, 602a, 702a, . . . , 802a, 902a, 402a, 502a, 602b, 602b, . . . , 802b, and 902b can be selectively set to the first to third wiring layers 400a, 500a, . . . , and 900a.

Figure 48:
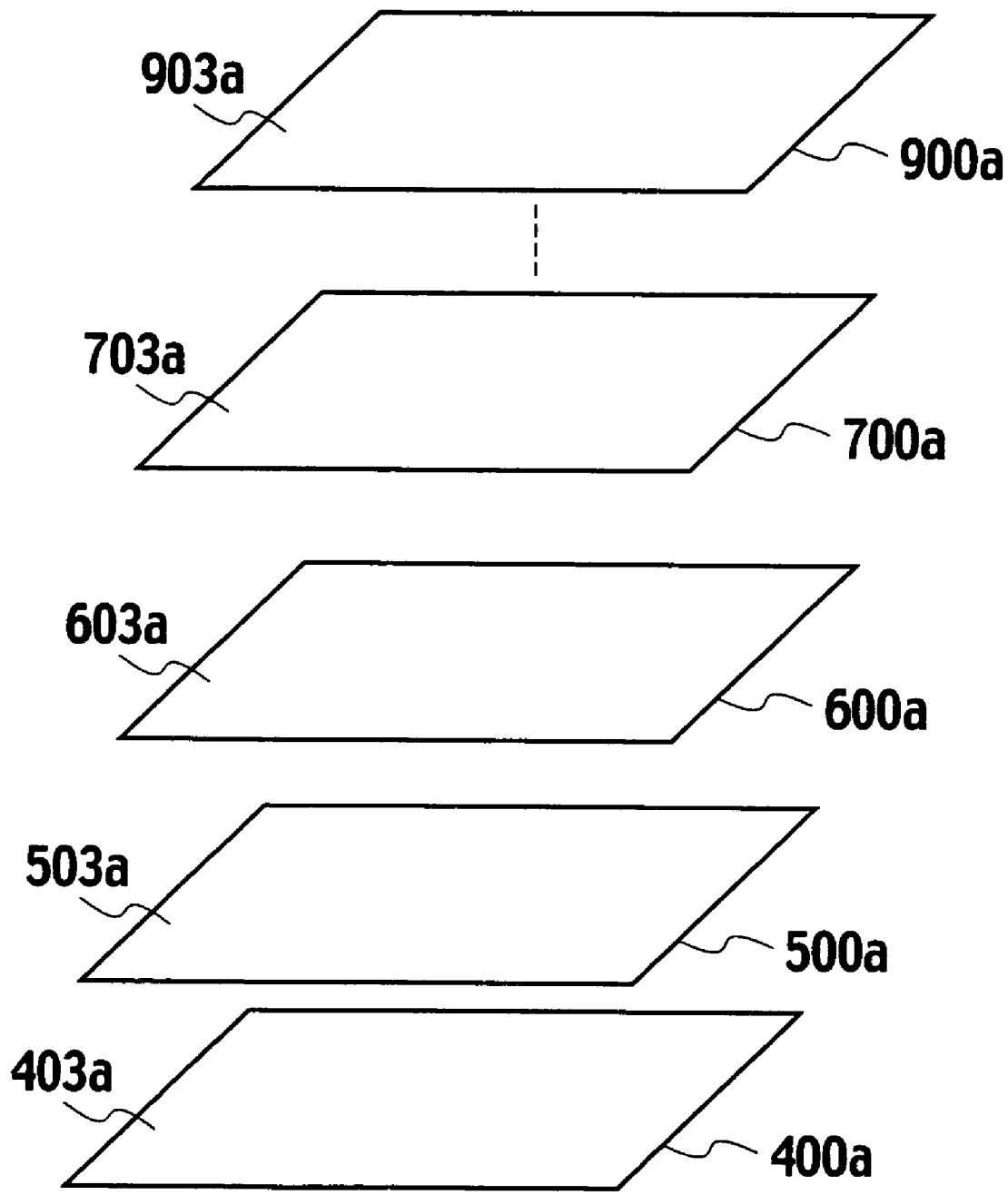
FIG. 48 is a schematic view illustrating grid areas of the multi-level interconnect in the semiconductor integrated circuit according to the other embodiments of the present invention.

As shown in the plan view of FIG. 46 and the plane view of FIG. 47, the positions of the first to (k+1)-th diagonal grid areas 402a, 502a, 602a, 702a, . . . , 802a, and 902a are not limited to the same areas and can be positioned on different areas. In this case, the diagonal grid areas are set over the entire areas positioned over the areas R1 through R3 where crosstalk may occur. In addition, since the first replacement area setting module 145 can replace the first to (k+1)-th grid areas 401a, 501a, 601a, 701a, . . . , and 901a shown in FIG. 42 to the first to (k+1)-th diagonal grid areas 403a, 503a, 603a, 703a, . . . , and 903a shown in FIG. 48, the diagonal wires may be placed in entire layer of the semiconductor integrated circuit.

What is claimed is:

1. A computer automated design system, adapted for designing a multi-level interconnect of a semiconductor integrated circuit, comprising:
a subject routing module configured to set a first grid area defined by a first line group and a second line group orthogonal to the first line group and a first diagonal grid area defined by a third line group extending diagonally to the first line group and a fourth line group orthogonal to the third line group in a subject wiring layer assigned as one of wiring layers in the multi-level interconnect, the third and fourth line groups being connected to the first to second line groups, and route a first wire in the first grid area and a first diagonal wire extending diagonally to a longitudinal direction of the first wire in the first diagonal grid area based on the first to fourth line groups; and
a next routing module configured to set a second grid area defined by the first and second line groups and a second diagonal grid area defined by the third and fourth line groups in an upper wiring layer assigned on the subject wiring layer in the multi-level interconnect so that the second grid area and second diagonal grid area overlap the first grid area and first diagonal grid area, and route a second wire in the second grid area and a second diagonal wire extending diagonally to a longitudinal direction of the second wire in the second diagonal grid area based on the first to fourth line groups.

2. The system of claim 1, further comprising:
other routing modules configured to set upper grid areas overlapping the second grid area and upper diagonal grid areas overlapping the second diagonal grid area, the upper grid areas and the upper diagonal grid areas are set to entire wiring layers above the upper wiring layer.

3. The system of claim 2, wherein the entire wiring layers implementing the multi-level interconnect include one of three to eighteen layers.

4. The system of claim 1, wherein the subject routing module sets the first diagonal grid area based on placement information of macrocells provided under the subject wiring layer so that the first diagonal grid area overlap the macrocells.

5. The system of claim 1, further comprising:
a replacement module configured to remove any one of the first wire and the first diagonal wire based on a result of routing the first wire and the first diagonal wire and set a replacement area in the subject wiring layer, the replacement area being defined by a fifth line group extending diagonally to an extending direction of the removed wire and a sixth line group orthogonal to the fifth line group; and
a rerouting module configured to reroute any one of the first wire and first diagonal wire in the replacement area based on the fifth and sixth line groups.

6. The system of claim 5, wherein the replacement area is set in each of upper wiring layers provided above the subject wiring layer.

7. The system of claim 5, wherein the replacement area is determined by congestion degree of the first wire and the first diagonal wire.

8. The system of claim 5, wherein the replacement area is determined by probability of occurrence of crosstalk.

9. A computer automated design method for designing a multi-level interconnect of a semiconductor integrated circuit, comprising:
setting a first grid area defined by a first line group and a second line group orthogonal to the first line group and a first diagonal grid area defined by a third line group extending diagonally to the first line group and a fourth line group orthogonal to the third line group in a subject wiring layer assigned as one of wiring layers in the multi-level interconnect, the third and fourth line groups being connected to the first to second line groups, and route a first wire in the first grid area and a first diagonal wire extending diagonally to a longitudinal direction of the first wire in the first diagonal grid area based on the first to fourth line groups; and
setting a second grid area defined by the first and second line groups and a second diagonal grid area defined by the third and fourth line groups in an upper wiring layer assigned on the subject wiring layer in the multi-level interconnect so that the second grid area and second diagonal grid area overlap the first grid area and first diagonal grid area, and route a second wire in the second grid area and a second diagonal wire extending diagonally to a longitudinal direction of the second wire in the second diagonal grid area based on the first to fourth line groups.

10. The method of claim 9, further comprising:
removing any one of the first wire and the first diagonal wire based on a result of routing the first wire and the first diagonal wire and set a replacement area in the subject wiring layer, the replacement area being defined by a fifth line group extending diagonally to an extending direction of the removed wire and a sixth line group orthogonal to the fifth line group; and
rerouting any one of the first wire and first diagonal wire in the replacement area based on the fifth and sixth line groups.

11. The method of claim 9, wherein the replacement area is determined by congestion degree of the first wire and the first diagonal wire.

12. The method of claim 9, wherein the replacement area is determined by probability of occurrence of crosstalk.

13. The method of claim 9, wherein the first diagonal grid area is set to overlap macrocells provided under the subject wiring layer based on placement information of the macrocells.

14. A semiconductor integrated circuit including a multi-level interconnect, the multi-level interconnect comprising:
a subject wiring layer assigned as one of wiring layers implementing the multi-level interconnect, including a subject wire area placing a subject wire extending along a first direction and a subject diagonal wire area placing a subject diagonal wire being connected to the subject wire and extended diagonally to the first direction;
a first insulating film on the subject wiring layer;
an upper wiring layer provided on the first insulating film including an upper wire area placing an upper wire extending along the first direction and an upper diagonal wire area placing an upper diagonal wire connected to the upper wire and extended diagonally to the first direction, the upper wire area and the upper diagonal wire area being provided above the subject wire area and the subject diagonal wire area;
a first upper via plug buried in the first insulating film;
a first upper diagonal wire connected to the first upper via plug;
a second upper via plug buried in the first insulating film, having different height with the first upper via plug; and
a second upper diagonal wire buried in the first insulating film,
wherein a height of an upper surface of the first upper diagonal wire is lower than a height of an upper surface of the second upper diagonal wire.

15. The semiconductor integrated circuit of claim 14, wherein the height of the upper surface of the first upper diagonal wire is substantially the same as the height of a lower surface of the second upper diagonal wire.

16. The semiconductor integrated circuit of claim 14, wherein the multi-level interconnect further comprises a stopper film provided on the first upper diagonal wire.

17. The semiconductor integrated circuit of claim 14, wherein the multi-level interconnect further comprises a stopper film provided on the second upper diagonal wire.

* * * * *